(12) United States Patent
Maehara

(10) Patent No.: US 7,653,852 B2
(45) Date of Patent: Jan. 26, 2010

(54) SEMICONDUCTOR DEVICE AND METHOD OF ADDING TESTER CIRCUIT FOR THE SAME

(75) Inventor: Masakazu Maehara, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 317 days.

(21) Appl. No.: 11/700,151

(22) Filed: Jan. 31, 2007

(65) Prior Publication Data

US 2007/0192660 A1    Aug. 16, 2007

(30) Foreign Application Priority Data

Feb. 10, 2006  (JP) .............................. 2006-033835

(51) Int. Cl.
*G01R 31/28*  (2006.01)

(52) U.S. Cl. .................. 714/731; 714/707; 714/724; 714/726; 714/727; 714/729; 714/744; 703/1; 716/1; 716/7; 716/8; 716/10; 716/18

(58) Field of Classification Search .............. None
See application file for complete search history.

(56) References Cited

U.S. PATENT DOCUMENTS

| 7,076,709 | B2* | 7/2006 | Vermeulen et al. | 714/729 |
| 7,120,844 | B2* | 10/2006 | Wu | 714/731 |
| 7,330,994 | B2* | 2/2008 | Frederick | 713/600 |
| 7,409,613 | B2* | 8/2008 | Rich et al. | 714/731 |
| 2005/0055614 | A1* | 3/2005 | Yeh | 714/726 |
| 2005/0055615 | A1* | 3/2005 | Agashe et al. | 714/727 |
| 2007/0186132 | A1* | 8/2007 | Dingemanse | 714/726 |
| 2007/0255988 | A1* | 11/2007 | Wang et al. | 714/726 |

FOREIGN PATENT DOCUMENTS

JP    2002-196046    7/2002

* cited by examiner

*Primary Examiner*—John P Trimmings
(74) *Attorney, Agent, or Firm*—Foley & Lardner LLP

(57) ABSTRACT

A semiconductor device according to an embodiment of the present invention includes: a plurality of clock domains including a plurality of logic circuits operating in accordance with a clock signal; and a control circuit selectively supplying the clock signal to a predetermined number of clock domains selected from the plurality of clock domains based on a control signal.

18 Claims, 25 Drawing Sheets

| FUNCTION NAME | DETAILS OF FUNCTIONS |
|---|---|
| IN1 | CLOCK SIGNAL INPUT TERMINAL |
| IN2 | FREQUENCY SUBGROUP SELECTION SIGNAL INPUT TERMINAL |
| IN3n | TEST CONTROL SIGNAL INPUT TERMINAL |
| SCKn | FREQUENCY SUBGROUP CLOCK SIGNAL OUTPUT TERMINAL |
| Block_A | DECODER BLOCK |
| Block_B | CLOCK CONTROL BLOCK |
| Func1 | CLOCK SIGNAL IS OUTPUT TO ONLY FREQUENCY SUBGROUP SELECTED BASED ON FREQUENCY SUBGROUP SELECTION SIGNAL AND OFF STATE VALUE IS OUTPUT TO UNSELECTED FREQUENCY SUBGROUP |
| Func2 | SHIFT CYCLE/CAPTURE CYCLE UPON SCAN TEST AND CLOCK SIGNAL IN USER MODE ARE CONTROLLED BASED ON TEST CONTROL SIGNAL (CONTROL LOGIC VARIES BETWEEN EMBODIMENTS) |

Fig. 4

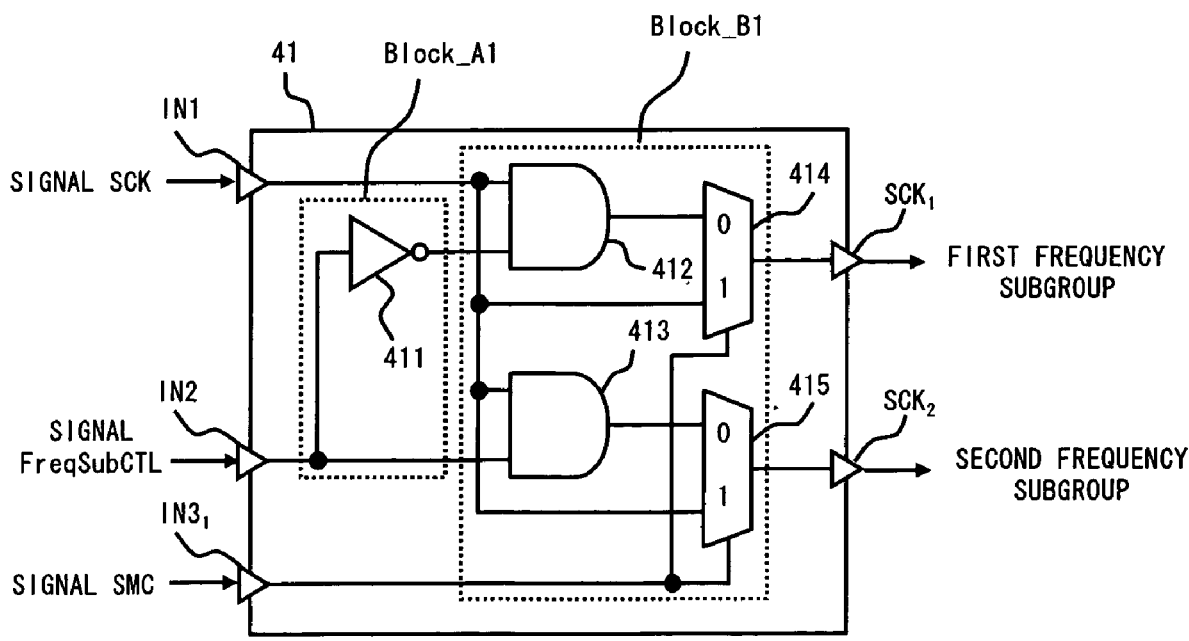

Fig. 5

| FreqSubCTL | SMC | $SCK_1$ | $SCK_2$ |
|---|---|---|---|
| Low | Low | SCK | X |
| High | Low | X | SCK |
| Low | High | SCK | SCK |
| High | High | SCK | SCK |

| FreqSubCTL | SMC | AMC | $SCK_1$ | $SCK_2$ | $SCK_3$ |
|---|---|---|---|---|---|
| Low | Low | Low | X | X | SCK |
| High | Low | Low | X | X | SCK |
| Low | High | Low | X | X | SCK |
| High | High | Low | X | X | SCK |
| Low | Low | High | SCK | X | SCK |
| High | Low | High | X | SCK | X |
| Low | High | High | SCK | SCK | SCK |
| High | High | High | SCK | SCK | SCK |

Fig. 14

| FreqSubCTL | SMC | AMC | SCK$_1$ | SCK$_2$ |
|---|---|---|---|---|
| Low | Low | Low | X | X |
| High | Low | Low | X | X |
| Low | High | Low | X | X |
| High | High | Low | X | X |
| Low | Low | High | SCK | X |
| High | Low | High | X | SCK |
| Low | High | High | SCK | SCK |
| High | High | High | SCK | SCK |

Fig. 18

SEMICONDUCTOR DEVICE AND METHOD OF ADDING TESTER CIRCUIT FOR THE SAME

BACKGROUND OF THE INVENTION

1. Field of the Invention

The present invention relates to a semiconductor device and a method of testing the semiconductor device. In particular, the invention relates to a semiconductor device including a clock control circuit that controls clock supply to an internal circuit of the semiconductor device and a method of testing the semiconductor device.

2. Description of Related Art

In recent years, integrated circuits such as LSI (Large Scale Integration) have proceeded toward a large-scale circuit, advanced functions, and miniaturization of elements. Further, a problem about a failure regarding a LSI's operational speed is not negligible. To test a failure regarding a speed, functional tests including a delay test should be carried out. The related art aiming at testing operations of the LSI is disclosed in Japanese Unexamined Patent Publication No. 2002-196046.

However, if the related art is applied to the recent LSI with a large scale circuit, a numerous number of test patterns need to be generated for the functional test. Alternatively, to perform the functional test with fewer test patterns, many terminals should be added. Thus, test period and cost increase due to testing with a numerous number of test patterns or a chip area increases due to the added terminals, resulting in a problem of increasing a chip cost.

A test method that limits the number of terminals is described next as Related Art 1. FIG. 19 shows a target semiconductor device. As shown in FIG. 19, the semiconductor device includes external clock domains operating in response to an externally supplied user clock and internal clock domains operating based on an internally generated clock. Further, the external clock domains and the internal clock domains may be classified into groups according to clock.

In the Related Art 1, the external clock domains are classified into an external clock domain 101 operating with a frequency of 10 MHz, an external clock domain 102 operating with a frequency of 20 MHz, and external clock domains 103, 104, and 105 operating with a frequency of 20 MHz. Further, user clock terminals U-CLK101 to U-CLK105 and user data input terminals D101 to D105 of the external clock domains 101 to 105 are connected together. The user clock terminals U-CLK101 to U-CLK105 supply a clock to the external clock domains 101 to 105. The user data input terminals D101 to D105 supply a data signal to the external clock domains 101 to 105.

In the Related Art 1, the internal clock domains are classified into internal clock domains 111 and 112 operating with a frequency of 10 MHz, and internal clock domains 113, 114, and 115 operating with a frequency of 20 MHz. Further, the internal clock domains 111 to 115 have interdependence through a data path. For example, the internal clock domain 111 operates based on data from the internal clock domain 113. The internal clock domain 112 operates based on data from the internal clock domain 111. The internal clock domain 113 operates based on data from the internal clock domain 115. The internal clock domain 114 operates based on data from the internal clock domain 113.

The functional test for the aforementioned semiconductor device is carried out in such a manner that the external clock domains 101 to 105 get logic circuits to operate based on a clock signal that is input through the user clock terminals U-CLK101 to U-CLK105 and a data signal that is input through the user data input terminals D101 to D105. The functional test for the internal clock domains 111 to 115 is performed in such a manner that a scan clock signal used in the internal clock domain is input from a scan clock supply terminal $SCK_{in}$ and the internal clock domains 111 to 115 operate based on the scan clock signal. In general, to input the scan clock signal to the internal clock domains 111 to 115 this way, a DFT (Design For Test) circuit including the scan clock supply terminal $SCK_{in}$ and a selector is added.

FIG. 20 is a flowchart of a procedure of adding the DFT circuit. As shown in FIG. 20, DFT-circuit preinsertion circuit information F101 is input first (step S101). Next, an internal clock domain is extracted from the DFT-circuit preinsertion circuit information F101 (step S102). Subsequently, a selector selecting a scan clock signal SCK and an internal clock signal and supplying the selected ones to the internal clock domain is added to the circuit information based on the extracted internal clock domain (step S103). Further, one scan clock supply terminal $SCK_{in}$ is added to the DFT-circuit preinsertion circuit information F101 (step S104). The scan clock supply terminal $SCK_{in}$ and the selector added in steps S103 and S104 are connected with each other (step S105). After that, generated DFT-circuit postinsertion circuit information F102 is output (step S106). Referring to this flowchart, information about the selector and the scan clock supply terminal $SCK_{in}$ are added to the circuit information. FIG. 21 is a block diagram of a semiconductor device corresponding to an internal clock domain portion where the information about the selector and the scan clock supply terminal $SCK_{in}$ are added.

As shown in FIG. 21, in the semiconductor device with the added information about the selector and the scan clock supply terminal $SCK_{in}$, the internal clock domains 111 to 115 are connected with selectors 121 to 125. The selectors 121 to 125 are supplied with a test mode control signal AMC designating which of signals input to the selectors is output. Further, a corresponding internal clock is input to "0" input of the selectors 121 to 125, and "1" input is connected with one scan clock supply terminal $SCK_{in}$.

FIG. 22 is a flowchart of a procedure of generating a test pattern used in the functional test for the internal clock domain of the semiconductor device as shown in FIG. 21. As shown in FIG. 22, the test pattern is generated as follows. First, it is determined whether or not there are internal clock domains requiring a test pattern (step S107). If it is determined that internal clock domains requiring a test pattern exist in step S107, a target internal clock domain is selected from the internal clock domains (step S108). Subsequently, a test pattern masking process is carried out on internal clock domains not requiring a test pattern (step S109). After that, a test pattern of the internal clock domain requiring a test pattern is automatically generated with ATPG (Automatic Test Pattern Generation) (step S110). After the ATPG is carried out to generate a test pattern, the control returns to step S107. The processes of steps S107 to S110 are repeated until a test pattern is generated for all internal clock domains. If it is determined that there is no internal clock domain requiring a test pattern in step S107, test pattern generation is finished.

FIG. 23 shows a test pattern example generated with reference to the flowchart of FIG. 22. As shown in FIG. 23, test patterns corresponding to the internal clock domains 111 to 115 are generated. In the Related Art 1, five patterns are generated. Here, in these test patterns, denoted by "X" is an off state value for stopping circuit operations. For example, "Low" is set. The off state value is generated through the masking process in step S109 of the flowchart of FIG. 22. The functional test of the semiconductor device in the Related Art 1 is carried out by inputting the test patterns of FIG. 23 into the internal clock domains 111 to 115 through a scan chain circuit (not shown).

Meanwhile, as another example of the functional test of theh semiconductor device of FIG. 19, a testing method that limits the number of test patterns is described next. This testing method is referred to as Related Art 2. FIG. 24 is a flowchart of a procedure of adding a DFT circuit in the Related Art 2.

As shown in FIG. 24, in the Related Art 2, DFT-circuit preinsertion circuit information F121 is input first (step S121) Next, an internal clock domain is extracted from the DFT-circuit preinsertion circuit information F121 (step S122). Subsequently, a selector selecting a scan clock signal SCK and an internal clock signal and supplying the selected ones to the internal clock domain is added to the circuit information (step S123). Further, plural scan clock supply terminals $SCK_{in}$ are added to the DFT-circuit preinsertion circuit information F121 (step S124). Plural scan clock supply terminals $SCK_{in}$ and the selector added in steps S123 and S124 are connected together (step S125). After that, the generated DFT-circuit postinsertion circuit information F122 is output (step S126). Referring to the flowchart, information about the selector and the scan clock supply terminals $SCK_{in}$ are added to the circuit information. FIG. 25 shows a semiconductor device where the information about the selector and the scan clock supply terminal $SCK_{in}$ are added.

As shown in FIG. 25, in the semiconductor device added with the information about the selector and the scan clock supply terminal $SCK_{in}$ in the Related Art 2, the selectors 121 to 125 are connected with the internal clock domains 111 to 115, respectively. A test mode control signal AMC indicating which of the signals input to the selectors is input to the selectors 121 to 125. Further, a corresponding internal clock is input to "0" input of the selectors 121 to 125, and "1" input is connected with a corresponding one of the scan clock supply terminals $SCK_{in}$.

FIG. 26 is a flowchart of a procedure of generating a test pattern used in a functional test of an internal clock domain of the semiconductor device of FIG. 25. As shown in FIG. 26, in the Related Art 2, a between the internal clock domains is extracted first (step S127). Subsequently, in accordance with the data-path-based interdependence extracted in step S127, internal clock domains not influenced by each other are grouped, and an internal clock domain group is extracted (step S128).

After that, it is determined whether or not there are internal clock domain groups requiring a test pattern (step S129). If it is determined that internal clock domain groups requiring a test pattern exist in step S129, a target internal clock domain group is selected from the internal clock domain groups (step S130). Subsequently, a test pattern masking process is carried out on internal clock domain groups not requiring a test pattern (step S131). After that, a test pattern of the internal clock domain group requiring a test pattern is automatically generated with ATPG (Automatic Test Pattern Generation) (step S132). After the ATPG is carried out to generate a test pattern, the control returns to step S129. The processes of steps S129 to S132 are repeated until a test pattern is generated for all internal clock domain groups. If it is determined that there is no internal clock domain group requiring a test pattern in step S129, the test pattern generation is finished.

FIG. 27 shows a test pattern example generated with reference to the flowchart of FIG. 26. As shown in FIG. 27, there are three test patterns corresponding to three groups, first to third groups obtained by classifying internal clock domains according to data-path-based interdependence between the internal clock domains. A functional test of the semiconductor device in the Related Art 2 is carried out by inputting the test patterns of FIG. 27 into the internal clock domains 111 to 115 through a scan chain circuit (not shown).

However, in the testing method for the semiconductor device in the Related Art 1, although the number of added terminals is 1, the number of generate test patterns increases. This leads to a problem of increasing a test period or test cost.

Further, in the testing method for the semiconductor device in the Related Art 2, the number of test patterns can be limited, but the number of added terminals increases, resulting in a problem that chip area and cost increase.

SUMMARY OF THE INVENTION

A semiconductor device according to an aspect of the present invention includes: a plurality of clock domains including a plurality of logic circuits operating in accordance with a clock signal; and a control circuit selectively supplying the clock signal to a predetermined number of clock domains selected from the plurality of clock domains based on a control signal.

According to another aspect of the invention, a method of adding a tester circuit that adds a tester circuit to a semiconductor device including a plurality of clock domains including a plurality of logic circuits operating in accordance with a clock signal by use of a computer, includes: inputting first circuit information prior to insertion of the tester circuit; deriving test frequency information of a clock domain based on second circuit information representing a frequency of the clock signal supplied to the clock domain; extracting data-path-based interdependence representing how clock domains transmit/receive data to/from each other based on the first circuit information; deriving information about a plurality of first groups obtained by grouping a predetermined number of clock domains based on the first circuit information and the test frequency information; deriving information about a plurality of second group obtained by grouping clock domains operating independently of each other in one first group based on the data-path-based interdependence and the information about the first group; and adding to the first circuit information, information about a control circuit including output terminals of the clock signal as many as the second subgroups in the connected first group, and controlling a clock domain to which the input clock signal is supplied, for each of the second groups.

The semiconductor device according to the present invention includes a control circuit inserted based on the method of adding the tester circuit. The control circuit selectively supplies a clock signal to a clock domain selected from the plurality of clock domains in accordance with an externally input control signal. Since control circuits are provided for each of the plurality of first groups in this way, it is possible to generate a test pattern and simultaneously carry out a functional test on clock domains of different first groups. Thus, a test period can be reduced. Further, it is possible to synthesize test patterns of clock domains that can undergo a functional test at the same time and generate one test pattern. Hence, the number of test patterns to generate can be reduced.

Further, the control circuit can selectively supply one clock signal to a predetermined number of clock domains. In contrast, a scan clock supply terminal is added to each clock domain and a scan clock signal is supplied to a clock domain in the related art. That is, the semiconductor device of the present invention needs only to add terminals as many as first groups for the functional test and can reduce the number of first clock supply terminals to be added as compared with a conventional semiconductor device. Further, the control circuit can control a clock domain to which an input clock signal is supplied, so an existing terminal can be used. Accordingly, the number of terminals to be added can be further reduced.

BRIEF DESCRIPTION OF THE DRAWINGS

The above and other objects, advantages and features of the present invention will be more apparent from the following description taken in conjunction with the accompanying drawings, in which:

FIG. 4 is a table of functions of a control circuit of the first embodiment;

FIG. 5 is a circuit diagram of the control circuit of the first embodiment;

FIG. 14 shows control logic of a control circuit of the third embodiment;

FIG. 18 shows control logic of a control circuit of the fourth embodiment;

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

A first embodiment of the present invention is described below. A semiconductor device of the present invention includes a tester circuit (for example, DFT (Design For Test) circuit) for supplying, in the case of executing a functional test for a logic circuit operating in accordance with an internally generated internal clock among logic circuits of the semiconductor device, a first clock (scan clock signal) which is externally supplied to the logic circuit operating in accordance with the internal clock.

Figure 1:
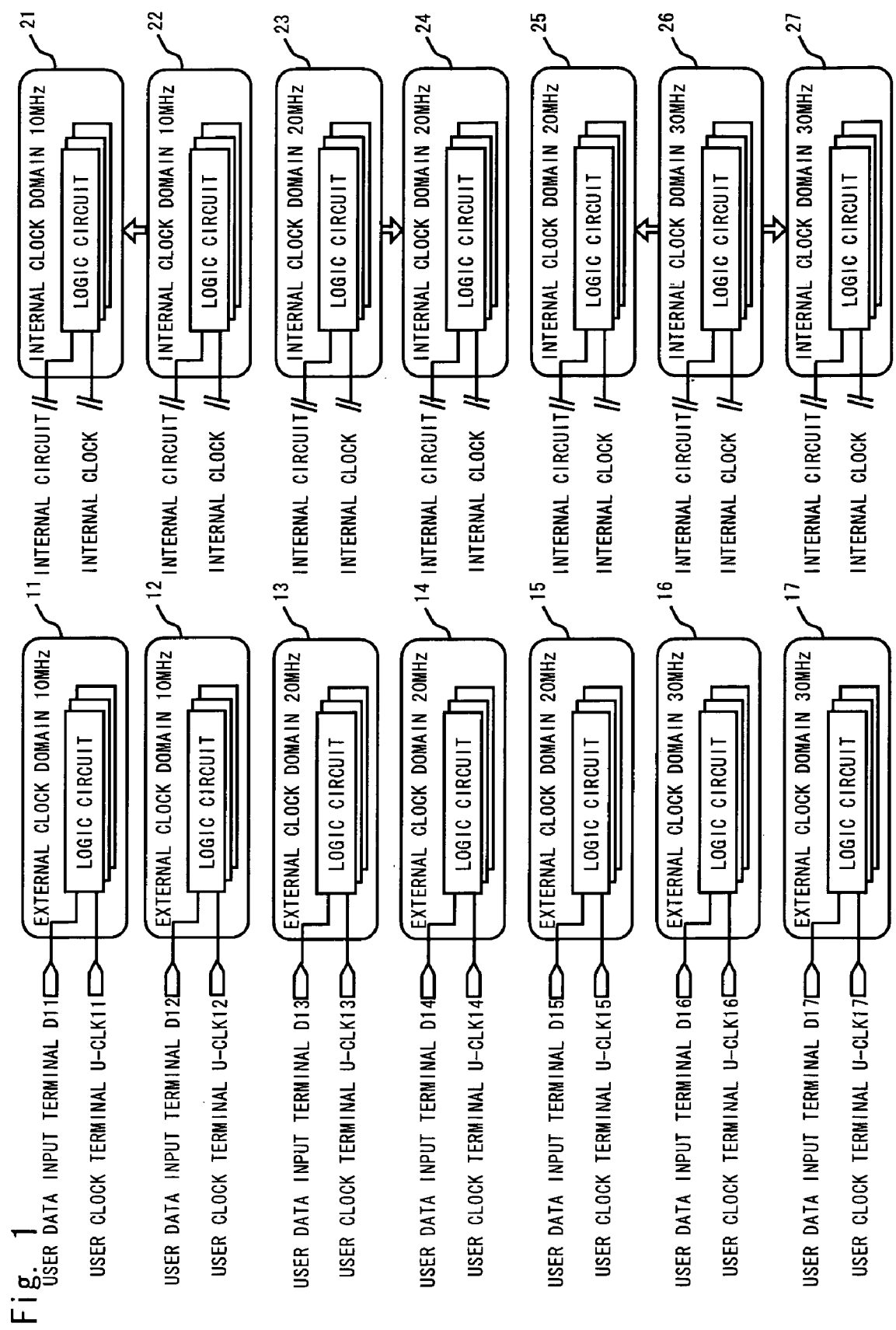
FIG. 1 is a block diagram of a semiconductor device according to a first embodiment of the present invention, which is not added with a DFT circuit.

FIG. 1 is a block diagram of the semiconductor device of the first embodiment which is added with no DFT circuit. The semiconductor device of FIG. 1 includes plural logic circuits, user data input terminals D11 to D17, and user clock terminals U-CLK11 to U-CLK17. Logic circuits that operate based on the same clock signal out of the supplied clocks are grouped. The user data input terminals D11 to D17 are input terminals where data is supplied from the outside. The user clock terminals U-CLK11 to U-CLK17 are input terminals where a clock is supplied from the outside.

Further, in this embodiment, there are external clock domains 11 to 17 and internal clock domains 21 to 27 obtained by classifying the plural logic circuits into groups according to clock signal. The external clock domains 11 to 17 are obtained by grouping logic circuits connected with the same user clock terminal. The internal clock domains 21 to 27 are obtained by grouping logic circuits that operate based on internal clock signals supplied from the same source among the logic circuits supplied with internally generated internal clock signal. In this embodiment, the external clock domains 11 and 12 operate in accordance with a clock signal having a frequency of 10 MHz ⊘ clock signal, and the external clock domains 13, 14, and 15 operate in accordance with a clock signal having a frequency of 20 MHz, and the external clock domains 16 and 17 operate in accordance with a clock signal having a frequency of 30 MHz. Further, the internal clock domains 21 and 22 operate in accordance with a clock signal having a frequency of 10 MHz, and the internal clock domains 23, 24, and 25 operate in accordance with a clock signal having a frequency of 20 MHz. The internal clock domains 26 and 27 operate in accordance with a clock signal having a frequency of 30 MHz.

Here, logic circuits belonging to the external clock domains 11 to 17 are supplied with data from the user data input terminals D11 to D17, respectively. Logic circuits belonging to the internal clock domains 21 to 27 are supplied with data from logic circuits belonging to the other internal clock domains or an internal circuit (not shown). Here, a relation that one clock domain operates based on data input from another clock domain is referred to as a "data-path-based interdependence". In this embodiment, there is a data-path-based interdependence between the internal clock domain 22 and the internal clock domain 21, between the internal clock domain 24 and the internal clock domain 23, between the internal clock domain 25 and the internal clock domain 26, and between the internal clock domain 27 and the internal clock domain 26.

Figure 2:
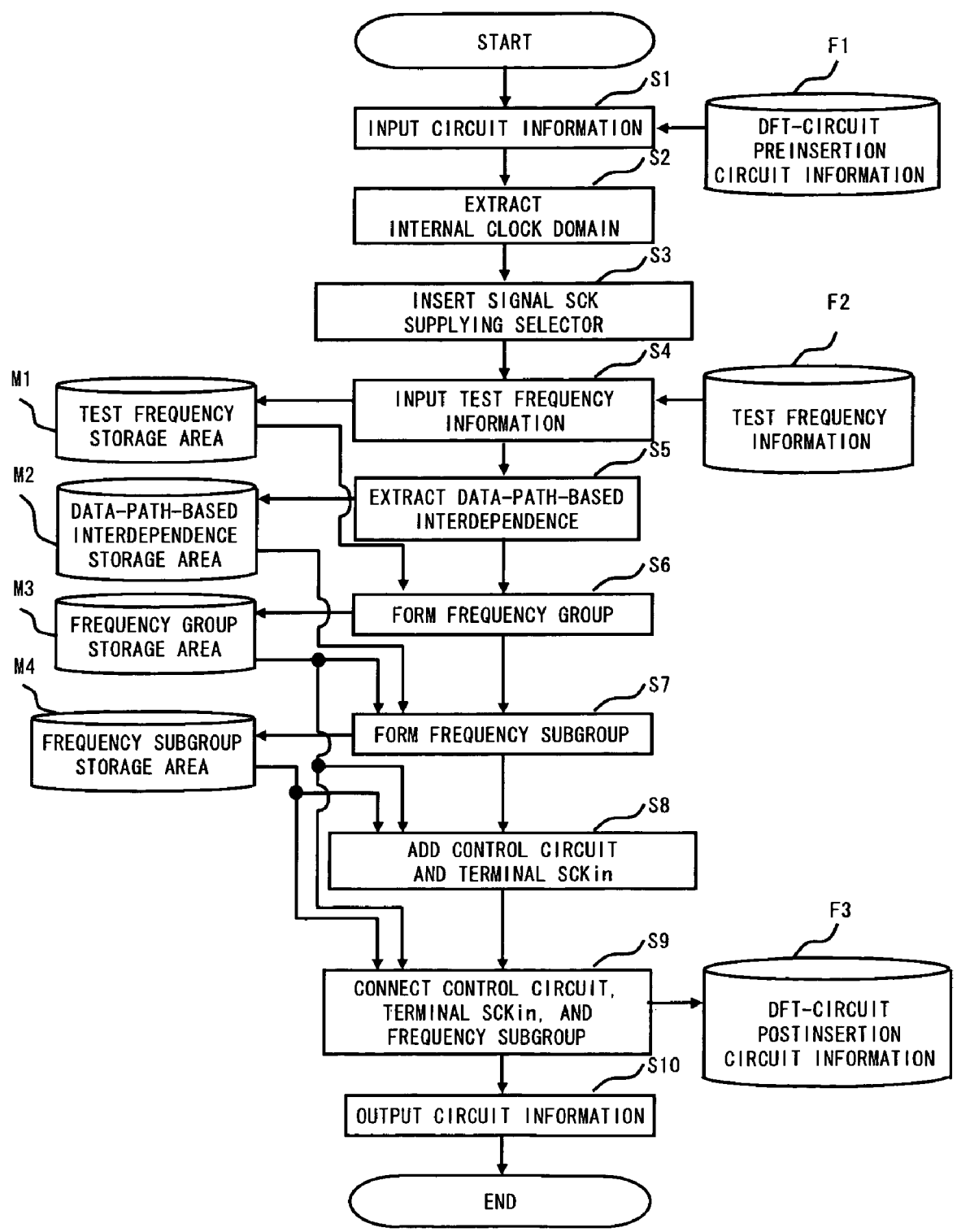
FIG. 2 is a flowchart of a procedure of adding a DFT circuit of the first embodiment.

According to the present invention, a DFT circuit is added to the semiconductor device of FIG. 1 to execute a functional test for logic circuits belonging to the internal clock domain. FIG. 2 is a flowchart of a procedure of adding a DFT circuit of the first embodiment.

The flowchart of FIG. 2 is executed with, for example, a computer or other such apparatus. According to the procedure of adding a DFT circuit of the first embodiment, first circuit information (for example, DFT-circuit preinsertion circuit information F1) describing logic circuits of the semiconductor device of FIG. 1 and how the logic circuits are connected is input (step S1). Subsequently, an internal clock domain is extracted based on the DFT-circuit preinsertion circuit information F1 (step S2). Based on the internal clock domain information extracted in step S2, a selector for supplying a scan clock signal is added to the DFT-circuit preinsertion circuit information F1 (step S3).

Next, second circuit information (for example, test frequency information F2) as information about a frequency of each clock signal supplied to the internal clock domains in the functional test is input (step S4). The test frequency information F2 input in step S4 is memorized in a test frequency storage area M1. Further, the data-path-based interdependence between internal clock domains extracted in step S2 is extracted, and information about the extracted one is memorized in a data-path-based interdependence storage area M2 (step S5). Further, based on the information about the internal clock domain extracted in step S2 and the information in the test frequency storage area M1, information about a first group (for example, frequency group) obtained by grouping internal clock domains that operate with the same clock frequency is derived (first step, for example, step S6). The frequency group information is memorized in a frequency group storage area M3.

Subsequently, based on the information in the data-path-based interdependence storage area M2 and the information in the frequency group storage area M3, information about a second group (for example, frequency subgroup) obtained by grouping internal clock domains that operate independently of each other among the internal clock domains belonging to the same frequency group is derived (second step, for example, step S7). That is, a frequency subgroup is obtained by grouping internal clock domains having no data-path-based interdependence among the internal clock domains belonging to the same frequency group. The frequency subgroup information derived in step S7 is memorized in a frequency subgroup storage area M4.

Based on the information in the frequency group storage area M3 and the information in the frequency subgroup storage area M4, a control circuit controlling scan clock signals used in a functional test and a scan clock supply terminal $SCK_{in}$ for supplying a scan clock signal are added to the DFT-circuit preinsertion circuit information F1 (control circuit adding step, for example, step S8). For example, control circuits as many as frequency groups are added, and scan clock supply terminals $SCK_{in}$ as many as the added control circuits are added.

Based on the information in the frequency group storage area M3, the information in the frequency subgroup storage area M4, and the information about the added control circuit, the scan clock supply terminal $SCK_{in}$, and the selector, the scan clock supply terminal $SCK_{in}$, the control circuit, the selector, and the internal clock domain are connected together (step S9). In step S9, a DFT circuit including the scan clock supply terminal $SCK_{in}$, the control circuit, and the selector are added to generate circuit information. The circuit information is output as third circuit information (for example, DFT-circuit postinsertion circuit information F3) (step S10).

Figure 3:
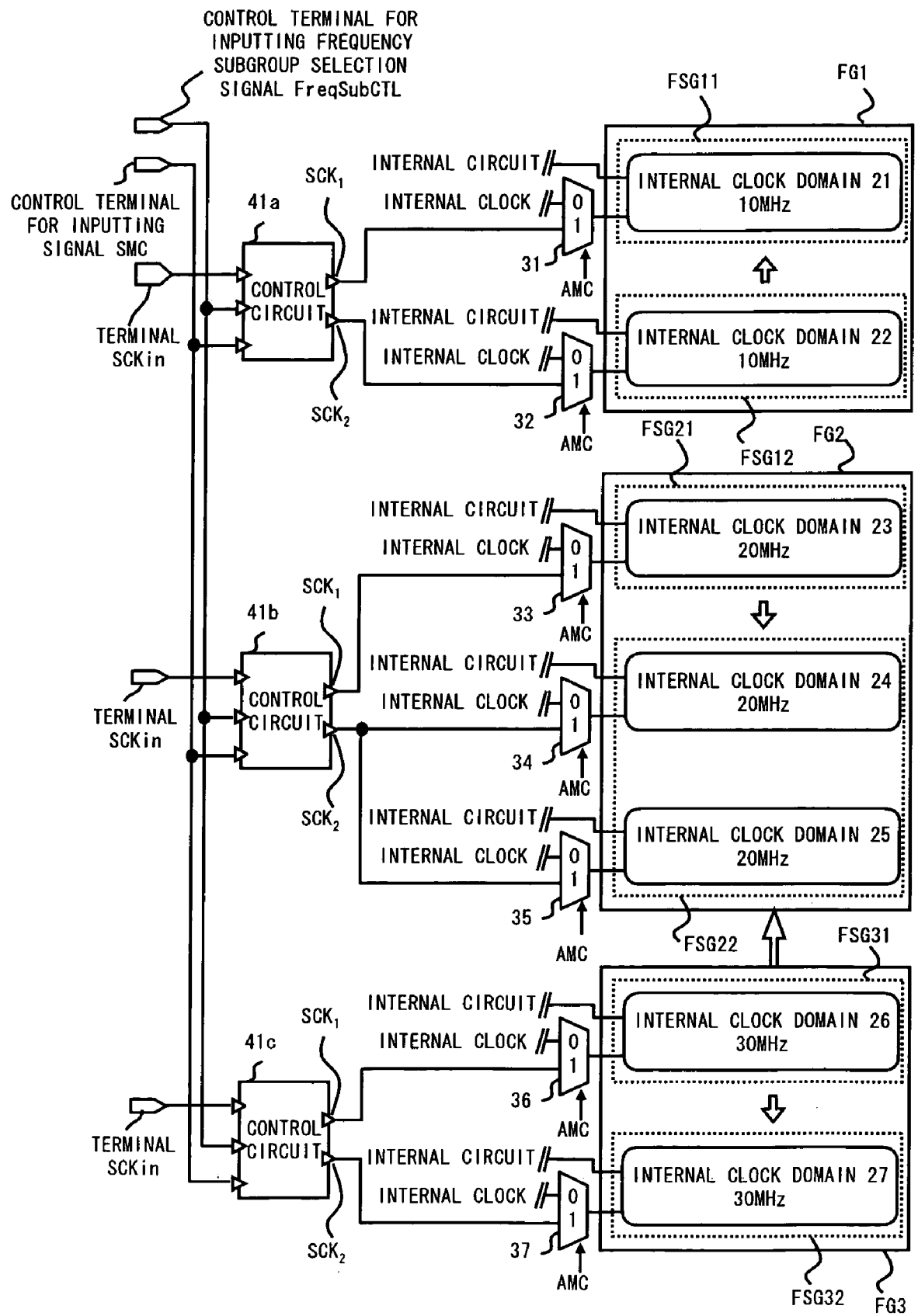
FIG. 3 is a block diagram of the semiconductor device of the first embodiment, which is added with a DFT circuit.

FIG. 3 is a block diagram of the semiconductor device of FIG. 1, which is added with the DFT circuit in accordance with the flowchart of FIG. 2. Incidentally, for ease of illustration, the user data input terminal and the user clock terminal connected with the external clock domain and the external clock domain are omitted from the semiconductor device as shown in a block diagram of FIG. 3.

Referring to FIG. 3, the semiconductor device added with the DFT circuit is described next. As shown in FIG. 3, the internal clock domains 21 to 27 are classified into groups according to data-path-based interdependence and test frequency. In this embodiment, the internal clock domains 21 and 22 are grouped to the first frequency group FG1, the internal clock domains 23, 24, and 25 are grouped to the second frequency group FG2, and the internal clock domains 26 and 27 are grouped to the third frequency group FG3 in accordance with a test frequency. Further, based on the data-path-based interdependence, the internal clock domains 21 and 22 belonging to the first frequency group FG1 are classified into a frequency subgroup FSG11 and a frequency subgroup FSG12, respectively. The internal clock domain 23 and the internal clock domains 24 and 25 belonging to the second frequency group FG2 are classified into a frequency subgroup FSG21 and a frequency subgroup FSG22, respectively. The internal clock domains 26 and 27 belonging to the third frequency group FG3 are classified into a frequency subgroup FSG31 and a frequency subgroup FSG32, respectively.

The internal clock domains 21 to 27 are connected with the selectors 31 to 37. The selectors 31 to 37 each have a "1" input terminal and a "0" input terminal. Based on an externally input test mode control signal AMC, a signal input to any input terminal is output. For example, when the test mode control signal AMC is "1", a signal input to the "1" input terminal is output. When the test mode control signal AMC is "0", a signal input to the "0" input terminal is output. Further, the selectors 31 to 37 are supplied with scan clock signals from a control circuit corresponding to the "1" input terminal, and an internal clock signal is supplied to the "0" input terminal.

The control circuits 41a to 41c are arranged in accordance with the first to third frequency groups. Further, in the control circuits 41a to 41c, the scan clock supply terminal $SCK_{in}$, a control terminal where a test control signal (for example, scan mode control signal SMC), and a control terminal where a selection signal (for example, frequency subgroup selection signal FreqSubCTL) is input are connected, and the circuits have scan clock output terminals $SCK_1$ to $SCK_n$ (n represents the number of frequency subgroups in a corresponding frequency group).

How the control circuits and the selectors are connected in this embodiment is described next. The scan clock output terminal $SCK_1$ of the control circuit 41a supplies a scan clock signal to the internal clock domain 21 through the selector 31. The scan clock output terminal $SCK_2$ of the control circuit 41a supplies a scan clock signal to the internal clock domain 22 through the selector 32. The scan clock output terminal $SCK_1$ of the control circuit 41b supplies a scan clock signal to the internal clock domain 23 through the selector 33. The scan clock output terminal $SCK_2$ of the control circuit 41b supplies a scan clock signal to the internal clock domain 24 through the selector 34. Further, a scan clock signal is supplied to the internal clock domain 25 through the selector 35. The scan clock output terminal $SCK_1$ of the control circuit 41c supplies a scan clock signal to the internal clock domain 26 through the selector 36. The scan clock output terminal $SCK_2$ of the control circuit 41b supplies a scan clock signal to the internal clock domain 27 through the selector 37.

The above control circuits 41a to 41c are described in detail below. Here, the control circuits 41a to 41c are substantially the same, so the control circuit 41 is described on behalf of the control circuits 41a to 41c. FIG. 4 is a table of functions required of the control circuit 41 of this embodiment. As shown in FIG. 4, examples of the functions of the control circuit 41 include IN1, IN2, and IN3n (n represents the number of kinds of the test control signal), SCKn (n represents the number of frequency subgroups in a corresponding frequency group), Block_A, Block_B, Func1, and Func2. The function IN1 is a function of an input terminal for a scan clock signal. The function IN2 is a function of an input terminal for a selection signal such as a frequency subgroup selection signal FreqSubCTL. The function IN3n is a function of an input terminal for a test control signal such as a scan mode control signal SMC or a test mode control signal AMC. The function SCKn is a function of an output terminal for outputting a scan clock signal to each frequency subgroup in a corresponding frequency group. The function Block_A is a function of decoding a frequency subgroup selection signal FreqSubCTL. The function Block_B is a function of controlling a scan clock signal. The function Func1 is a function of outputting a scan clock signal only to a frequency subgroup that is selected based on a frequency subgroup selection signal FreqSubCTL, and outputting an off state value "X" to the remaining frequency subgroups. Here, the off state value is a value for stopping a block where a signal is supplied. In this embodiment, the off state value is represented by "X". The function Func2 is a function of controlling a shift cycle at which data is shifted upon the functional test (for example, scan test) and a cycle at which data is captured upon the functional test in accordance with a test control signal. Incidentally, the control logic of a signal for controlling the function Func2 differs between the embodiments.

FIG. 5 is circuit diagram of the control circuit 41. The control circuit 41 includes input terminals IN1, IN2, and $IN3_1$, a decoder block Block_A1, a scan clock control block Block_B2, and scan clock output terminals $SCK_1$ and $SCK_2$. The input terminal IN1 corresponds to the function IN1 and is connected with the scan clock supply terminal $SCK_{in}$ and supplied with a scan clock signal. The input terminal IN2 corresponds to the function IN2 and is connected with the control terminal for inputting a frequency subgroup selection signal FreqSubCTL and supplied with a frequency subgroup selection signal FreqSubCTL. The input terminal $IN3_1$ corresponds to the function IN3n and is connected with a control terminal for inputting a scan mode control signal SMC and supplied with a scan mode control signal SMC.

The decoder block Block_A1 corresponds to the function Block_A and has an inverter 411. The scan clock control block Block_B1 corresponds to the function Block_B and has AND circuits 412 and 413, and selectors 414 and 415.

One input terminal of the AND circuit 412 receives a scan clock signal. The other input terminal of the AND circuit 412 is connected with an output of the inverter 411. The output of the AND circuit 412 is connected with a "0" input terminal of the selector 414. A "1" input terminal of the selector 414 receives a scan clock signal. One terminal of the AND circuit 413 receives a scan clock signal. The other terminal of the AND circuit 413 receives a frequency subgroup selection signal FreqSubCTL through a decoder block Block_A1. An output of the AND circuit 413 is connected with a "0" input terminal of the selector 415. A "1" input terminal of the selector 415 receives a scan clock signal. The selectors 414 and 415 output signals input to either the "1" input terminal or the "0" input terminal based on the scan mode control signal SMC input from the input terminal $IN3_1$. Further, an output of the selector 414 is connected with the scan clock output terminal $SCK_1$, and an output of the selector 415 is connected with the scan clock output terminal $SCK_2$.

Figures 6, 7:
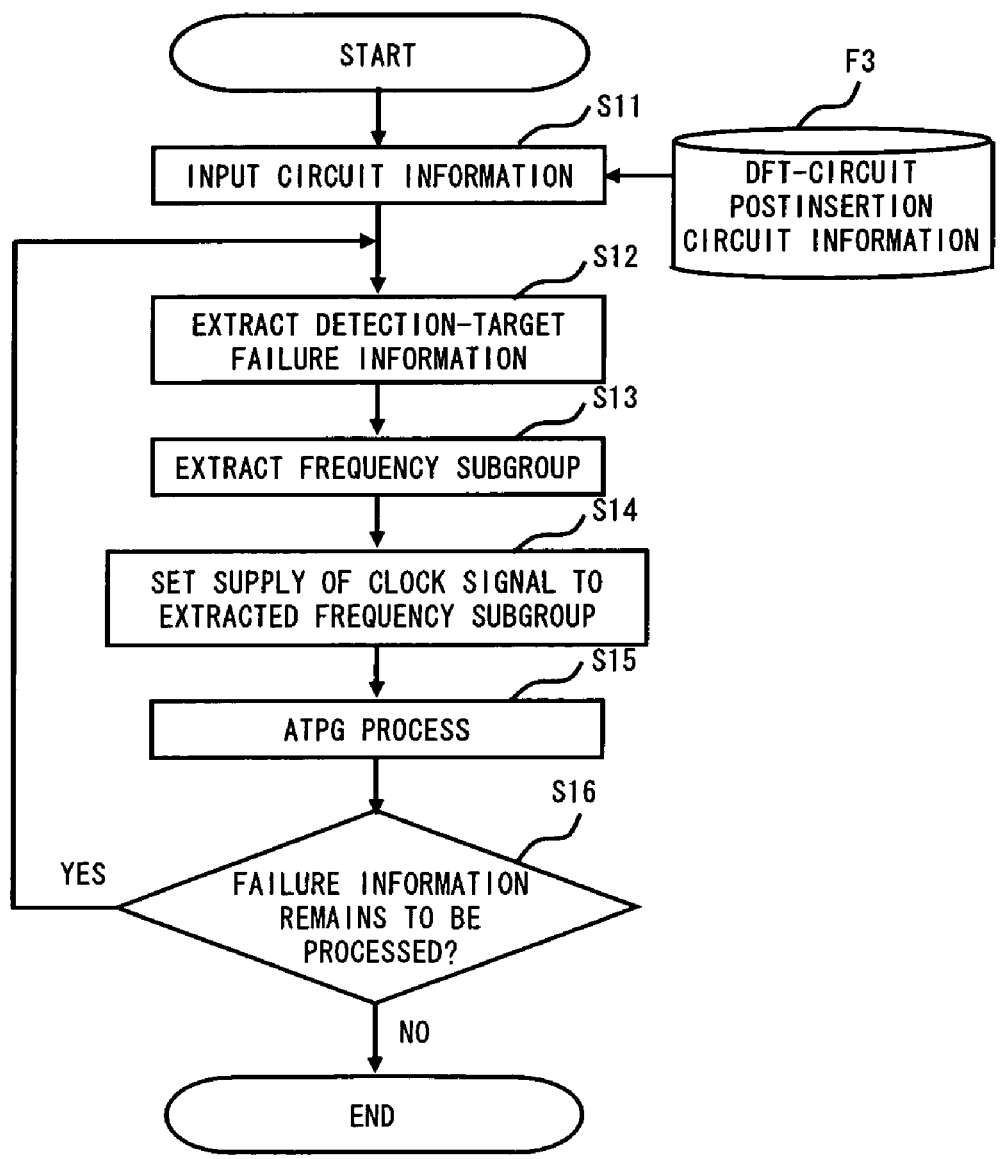
FIG. 6 shows control logic of the control circuit of the first embodiment.
FIG. 7 is a flowchart of an ATPG process of the first embodiment.

FIG. 6 shows a relation between states of the frequency subgroup selection signal FreqSubCTL and the scan mode control signal SMC and an output signal of the control circuit 41. Referring to FIG. 6, operations of the control circuit 41 are described next. As shown in FIG. 6, the control circuit 41 outputs a scan clock signal SCK from the scan clock output terminal $SCK_1$ and outputs an off state value "X" from the scan clock output terminal $SCK_2$ if the scan mode control signal SMC is in a "Low" state (for example, ground potential), and the frequency subgroup selection signal FreqSubCTL is in a "Low" state. Further, if the frequency subgroup selection signal FreqSubCTL is in a "High" state (for example, power supply potential), a scan clock signal SCK is output from the scan clock output terminal $SCK_2$, and an off state value "X" is output from the scan clock output terminal $SCK_1$. On the other hand, if the scan mode control signal SMC is in a "High" state, a scan clock signal SCK is output from the scan clock output terminal $SCK_1$ and the scan clock output terminal $SCK_2$ regardless of a value of the frequency subgroup selection signal FreqSubCTL.

That is, the control circuit 41 realizes the function Func1 by selecting a frequency subgroup to which a scan clock signal is supplied, based on a value of the frequency subgroup selection signal FreqSubCTL. Further, a scan clock signal is controlled to realize the function Func2 based on a value of the scan mode control signal SMC.

FIG. 7 is a flowchart of a procedure of generating a test pattern for the semiconductor device added with the DFT circuit as shown in FIG. 3. Referring to FIG. 7, a procedure of generating a test pattern is described. A test pattern is generated by executing an ATPG (Automatic Test Pattern Generation) process with, for example, a computer. As shown in FIG. 7, the DFT-circuit postinsertion circuit information F3 is input first to capture circuit information (step S11). Subsequently, failure modes in the circuit information are examined, and a failure mode to be detected (detection-target failure mode) is extracted (step S12) Further, a frequency subgroup to which the extracted detection-target failure mode is applied is extracted (step S13). A clock signal supplied to the extracted frequency subgroup is set (step S14). Based on the information obtained in steps S12 to S14, the ATPG process for automatically generating a test pattern is carried out (step S15). After that, it is determined whether or not failure modes remain to be examined (step S16). If failure modes remain to be examined, the control returns to step S12, and the process is repeated. If no failure mode remains to be examined, the process is finished. Incidentally, although not shown, a generated pattern is synthesized/compressed into a short test pattern.

Figure 8:
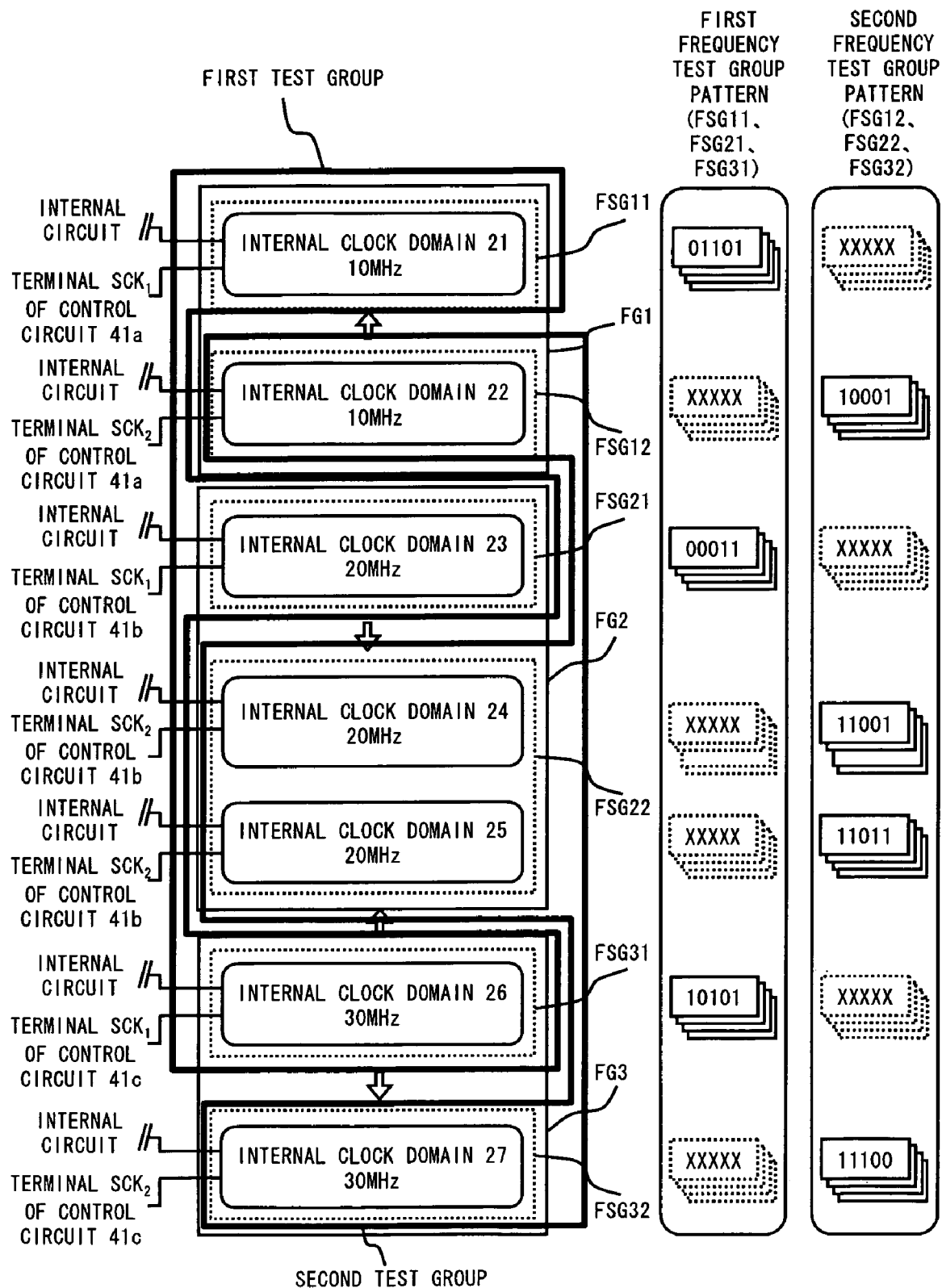
FIG. 8 shows a test pattern generated for the semiconductor device of the first embodiment.

FIG. 8 shows an example of the test pattern generated with reference to the flowchart of FIG. 7. As shown in FIG. 8, two types of patterns are generated: for example, a first frequency test group pattern for a group including the frequency subgroups FSG11, FSG21, and FSG31 and a second frequency test group pattern for a group including the frequency subgroups FSG12, FSG22, and FSG32. Incidentally, in each test group pattern, an off state value "X" is inserted to a test pattern for frequency subgroups not subjected to testing.

The test pattern of FIG. 8 is supplied to a scan pattern circuit (not shown), and a scan clock signal is supplied to an internal circuit through the control circuits 41a,41b,and 41c to execute a functional test on the internal clock domain. For example, in the case of executing a functional test with the first test group pattern, a scan clock signal of a corresponding frequency is output from the scan clock output terminal $SCK_1$ of the control circuits 41a,41b,and 41c. Hence, internal clock domains belonging to the frequency subgroups FSG11, FSG21, and FSG31 operate, and a functional test is carried out. Further, in the case of executing a functional test with a second test group pattern, a scan clock signal of a corresponding frequency is output from the scan clock output terminal $SCK_2$ of the control circuits 41a, 41b, and 41c. Hence, internal clock domains belonging to the frequency subgroups FSG12, FSG22, and FSG32 operate, and a functional test is carried out.

As understood from the above description, according to this embodiment, in the case of inserting a DFT circuit, a frequency group is extracted based on a test frequency of a target internal clock domain, and a frequency subgroup is extracted from the frequency group based on a data-path-based interdependence. Then, a control circuit is added to the circuit information based on a frequency group to determine the number of scan clock output terminals $SCK_n$ of the control circuit based on the frequency subgroup. As a result, it is possible to generate a test pattern for internal clock domains that differ in test frequency and have no data-path-based interdependence and to simultaneously test the domains.

For example, in the Related Art 1,if seven internal clock domains are prepared, seven test patterns should be generated for the internal clock domains. In contrast, in the semiconductor device of the first embodiment, a frequency subgroup obtained by grouping seven internal clock domains according to data-path-based interdependence is extracted, so two test patterns suffice for testing. Thus, the semiconductor device of the first embodiment can reduce a test period as compared with a semiconductor device of the Related Art 1.

Further, scan clock signals supplied to the internal clock domain can be controlled with a frequency subgroup selection signal FreqSubCTL and a scan mode control signal SMC supplied to the control circuit, so it is unnecessary to add a scan clock supply terminal for each internal clock domain. In the semiconductor device of the first embodiment, three scan clock supply terminals and two control terminals, that is, five terminals in total are added for the seven internal clock domains. In contrast, in the semiconductor device of the Related Art 2,seven scan clock supply terminals need to be added for the seven internal clock domains. That is, according to the semiconductor device of the first embodiment, it is possible to reduce the number of added terminals as compared with that of the semiconductor device of the Related Art 2 and reduce a chip area.

An influence that the number of terminals added for the functional test increases becomes strong as the number of internal clock domains increases. For example, provided that 100 internal clock domains are prepared, and seven test frequencies are used, in the semiconductor device of the Related Art 2, 100 scan clock supply terminals should be added, while in the semiconductor device of the first embodiment, six clock supply terminals and two control terminal, either terminals in total need only to be added.

Second Embodiment

A semiconductor device according to a second embodiment of the present invention differs from the first embodiment in terms of information input in step S4 of the flowchart for adding the DFT circuit of FIG. 2. The same components as those of the first embodiment are denoted by like reference numerals, and description thereof is omitted here.

Figure 9:
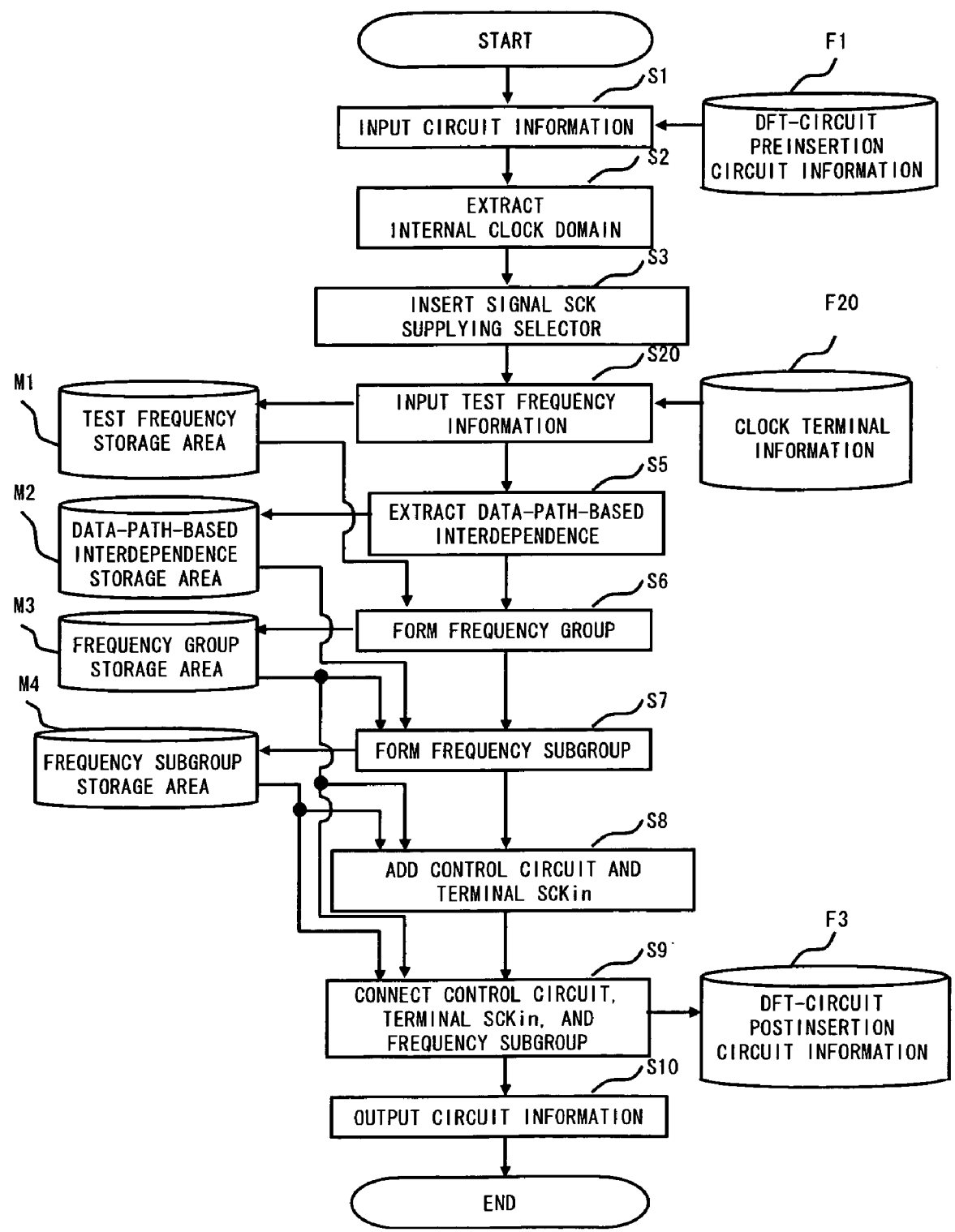
FIG. 9 is a flowchart of a procedure of adding a DFT circuit according to a second embodiment of the present invention.

FIG. 9 is a flowchart for adding a DFT circuit in the second embodiment. As shown in FIG. 9, in the second embodiment, step S20 is performed in place of step S4, and clock terminal information F20 representing frequency information of a clock signal input to a user clock terminal U-CLK is input as second circuit information. In contrast, in the first embodiment, a test frequency is input in step S4 of the flowchart of FIG. 2.

In step S20, information about a frequency of a clock signal input to the user clock terminal U-CLK is retrieved from the clock terminal information F20. Further, information about a divider or the like is retrieved from the DFT-circuit preinsertion circuit information F1. Based on these information, information about a test frequency of the internal clock domain is derived and memorized in the test frequency storage area M1.

Figure 10:
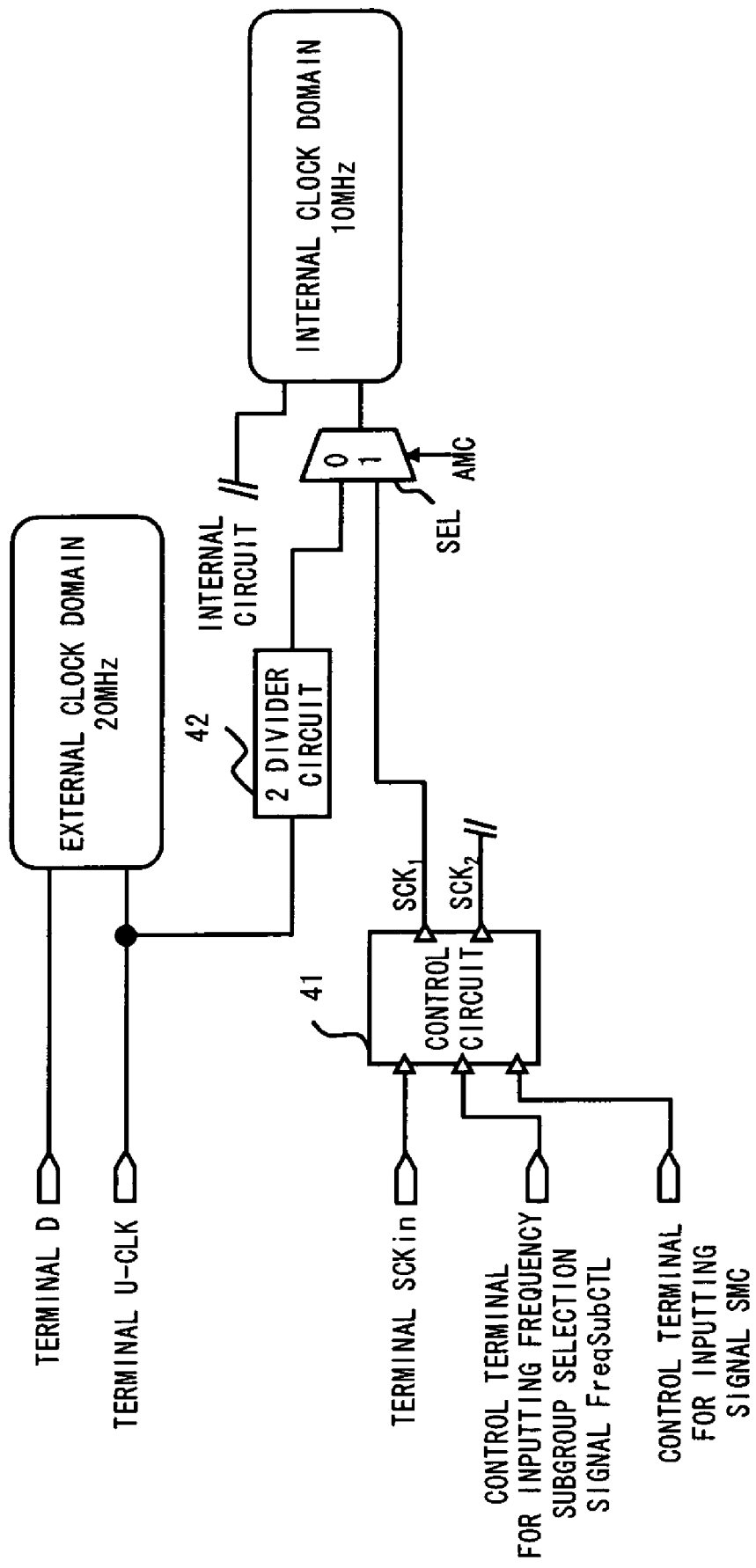
FIG. 10 is a block diagram of a relationship between external clock domains and internal clock domains of the second embodiment.

An example of the way to calculate a test frequency is described next. FIG. 10 shows a circuit example where a control circuit is added to a clock domain extracted based on the clock terminal information F20 and the DFT-circuit pre-insertion circuit information F1. As shown in FIG. 10, the internal clock domain receives a clock signal from a 2 divider circuit 42 connected with a user clock terminal U-CLK corresponding to an external clock domain operating with a frequency of 20 MHz. Therefore, a test frequency of the internal clock domain is 10 MHz.

That is, the semiconductor device of the second embodiment calculates a test frequency of the internal clock domain based on the information about a frequency of a clock signal supplied to the user clock terminal (clock terminal information F20) and the DFT-circuit preinsertion circuit information F1. This makes it possible to automatically calculate a test frequency of the internal clock domain based on the previously obtained clock frequency information of the user clock terminal without calculating a test frequency of the internal clock domain beforehand.

Third Embodiment

In the semiconductor device of the first embodiment, a scan clock signal is supplied to the control circuit from an added scan clock supply terminal. In contrast, in a semiconductor device according to a third embodiment of the present invention, a user clock terminal connected with an external clock domain is used as a scan clock supply terminal. The same components as those of the first embodiment are denoted by like reference numerals, and description thereof is omitted here.

Figure 11:
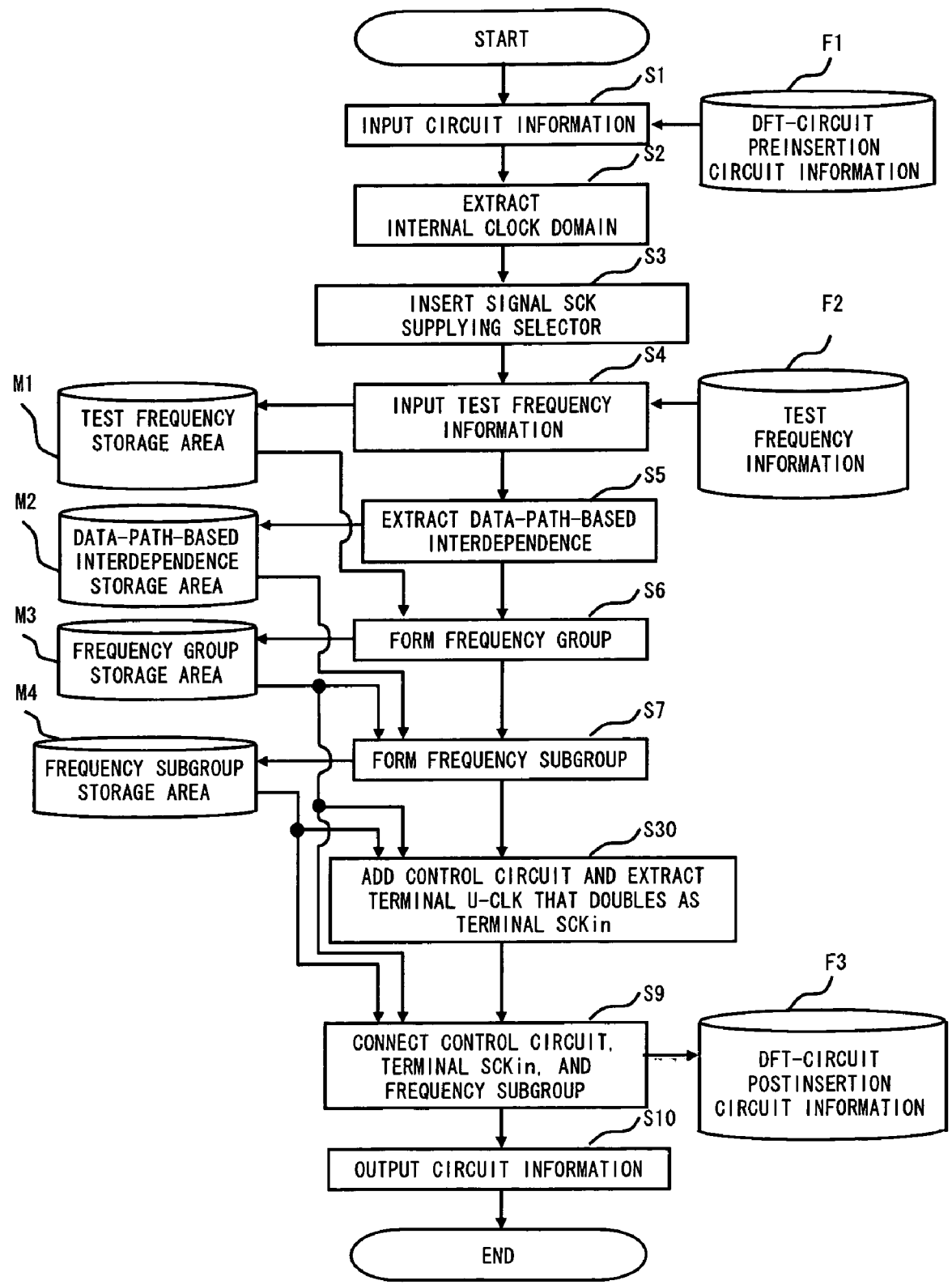
FIG. 11 is a flowchart of a procedure of adding a DFT circuit according to a third embodiment of the present invention.

FIG. 11 is a flowchart of a procedure of adding a DFT circuit to the semiconductor device of the third embodiment. As shown in FIG. 11, in the semiconductor device of the third embodiment, step S30 is carried out in place of step S8 in the flowchart of a procedure of adding a DFT circuit in the semiconductor device of the first embodiment. In step S30, a control circuit is added, and a user clock terminal U-CLK that doubles as the scan clock supply terminal $SCK_{in}$ is extracted. As for the extracted user clock terminal U-CLK, for example, a terminal receiving a clock signal the frequency of which is the same as a test frequency of the internal clock domain is selected.

Figure 12:
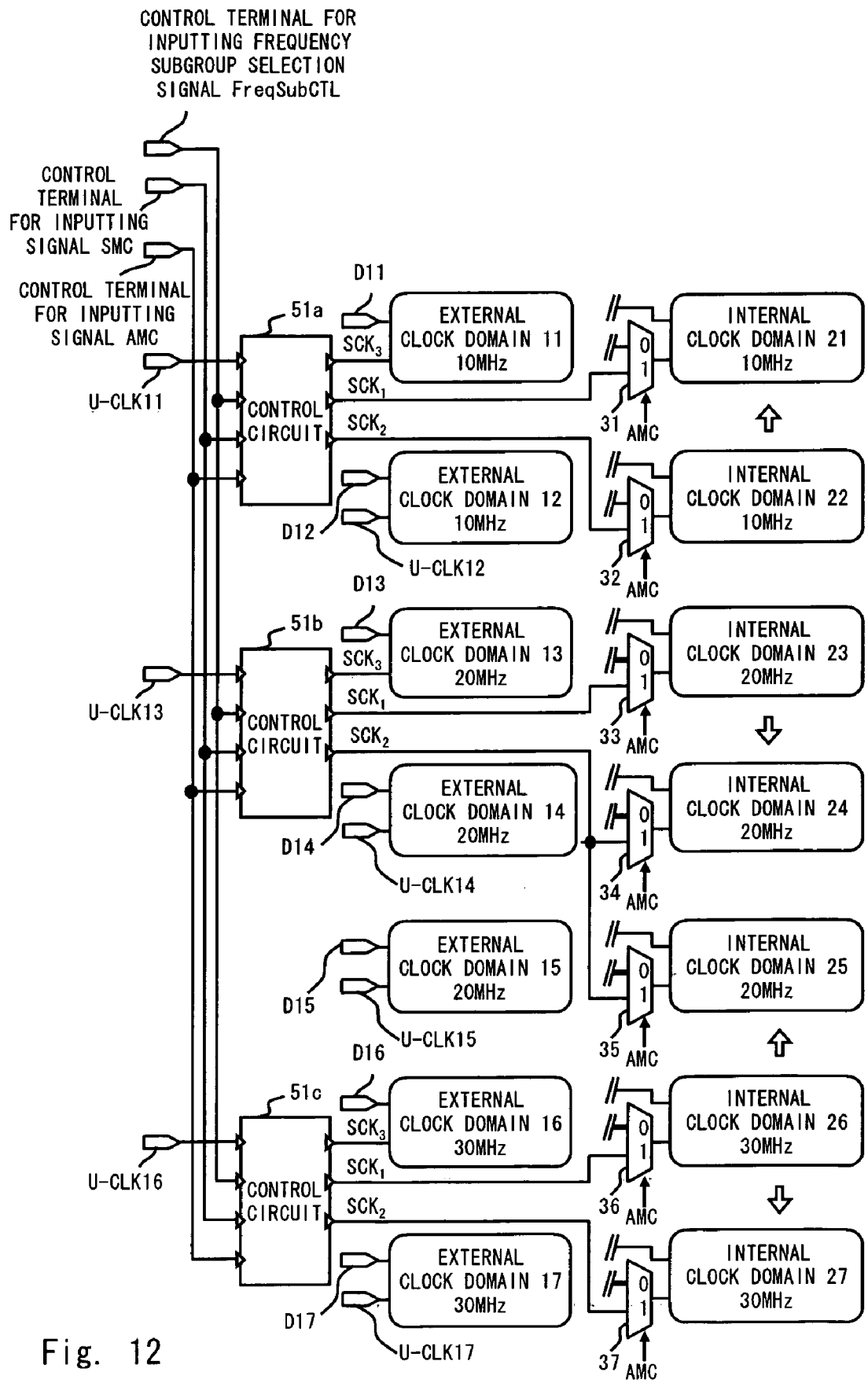
FIG. 12 is a block diagram of a semiconductor device added with a DFT circuit of the third embodiment.

FIG. 12 is a block diagram of the semiconductor device added with a DFT circuit generated in accordance with a flowchart of FIG. 11. As shown in FIG. 12, in the semiconductor device of the third embodiment, control circuits 51a, 51b, and 51c are added. The control circuits 51a, 51b, and 51c are connected with user clock terminals U-CLK11, U-CLK13, and U-CLK16, respectively. The user clock terminal U-CLK11 supplies a clock signal to the external clock domain 11. The user clock terminal U-CLK13 supplies a clock signal to the external clock domain 13. The user clock terminal U-CLK16 supplies a clock signal to the external clock domain 16.

Further, the control circuits 51a, 51b, and 51c are supplied with a frequency subgroup selection signal FreqSubCTL, a scan mode control signal SMC, and a test mode control signal AMC. Further, the control circuits 51a, 51b, and 51c include scan clock output terminals $SCK_1$, $SCK_2$, and $SCK_3$. The scan clock output terminals $SCK_1$ and $SCK_2$ are the same as those of the first embodiment. The scan clock output terminal $SCK_3$ supplies a clock signal to an external clock domain corresponding to a user clock terminal connected with a control circuit.

Figure 13:
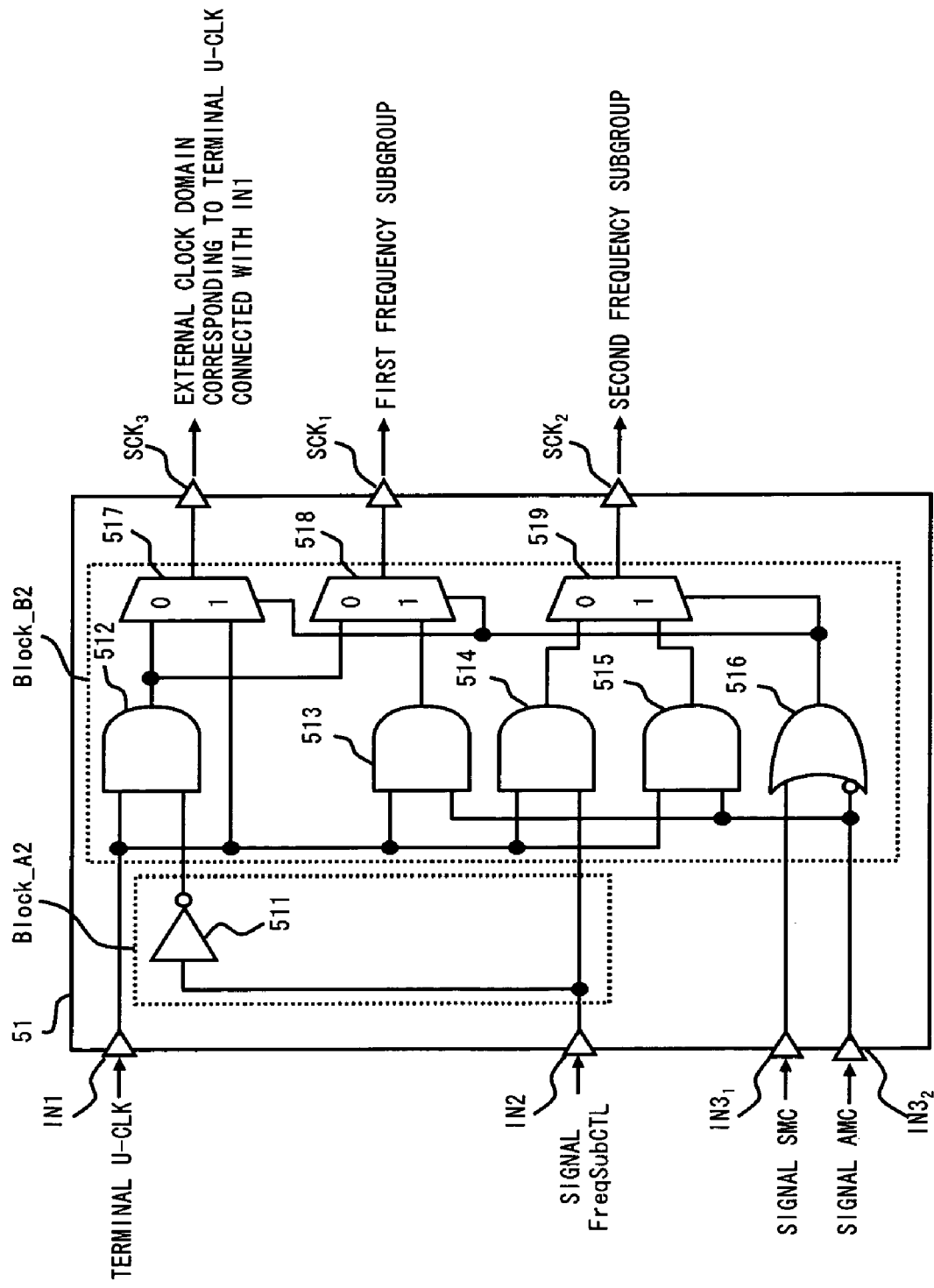
FIG. 13 is a circuit diagram of a DFT circuit according to a third embodiment of the present invention.

Here, the control circuits 51a, 51b, and 51c are described in detail below. The control circuits 51a, 51b, and 51c are the same and thus described as a control circuit 51 below. FIG. 13 is a circuit diagram of the control circuit 51. The control circuit 51 includes input terminals IN1, IN2, $IN3_1$, and $IN3_2$, output terminals $SCK_1$, $SCK_2$, and $SCK_3$, a decoder block Block_A2, and a scan clock control block Block_B2. The input terminal IN1 is connected with the user clock terminal U-CLK. The input terminal IN2 is connected with a control terminal receiving a frequency subgroup selection signal FreqSubCTL. The input terminal $IN3_1$ receives the scan mode control signal SMC. The input terminal $IN3_2$ receives the test mode control signal AMC. The decoder block Block_A2 includes an inverter 511. The scan clock control block Block_B2 includes AND circuits 512 to 515, an OR circuit 516, and selectors 517 to 519.

The control circuit 51 operates based on the control logic of FIG. 14 by use of these elements. As shown in FIG. 14, the control circuit 51 outputs a scan clock signal from only the scan clock output terminal $SCK_3$ regardless of values of the scan mode control signal SMC and the frequency subgroup selection signal FreqSubCTL if the test mode control signal AMC is at "Low" level.

Further, if the test mode control signal AMC is at "High" level, a scan clock signal is output from the scan clock output terminals $SCK_1$, $SCK_2$, and $SCK_3$ based on the scan mode control signal SMC and the frequency subgroup selection signal FreqSubCTL. For example, if the scan mode control signal SMC is at "Low" level, and the frequency subgroup selection signal FreqSubCTL is at "Low" level, a scan clock signal is output from the scan clock output terminal $SCK_1$ and the scan clock output terminal $SCK_3$, and an off state value "X" is output from the scan clock output terminal $SCK_2$. If the scan mode control signal SMC is at "Low" level, and the frequency subgroup selection signal FreqSubCTL is at "High" level, an off state value "X" is output from the scan clock output terminal $SCK_1$ and the scan clock output terminal $SCK_3$, and a scan clock signal is output from the scan clock output terminal $SCK_2$. Further, if the scan mode control signal SMC is at "High" level, a scan clock signal is output from the scan clock output terminals $SCK_1$, $SCK_2$, and $SCK_3$ regardless of a value of the frequency subgroup selection signal FreqSubCTL.

As understood from the above description, the semiconductor device of the third embodiment uses the user clock terminal U-CLK as the scan clock supply terminal $SCK_{in}$. That is, it is unnecessary to add a terminal for inputting a scan clock signal, so the semiconductor device of the third embodiment can reduce the number of added terminals as compared with the semiconductor device of the first embodiment.

Fourth Embodiment

In the semiconductor device of the first embodiment, a scan clock signal is supplied from the added scan clock supply terminal to the control circuit. In contrast, in a semiconductor device according to a fourth embodiment of the present invention, a user data input terminal connected with the external clock domain is used as a scan clock supply terminal. The same components as those of the first embodiment are denoted by like reference numerals, and description thereof is omitted here.

Figure 15:
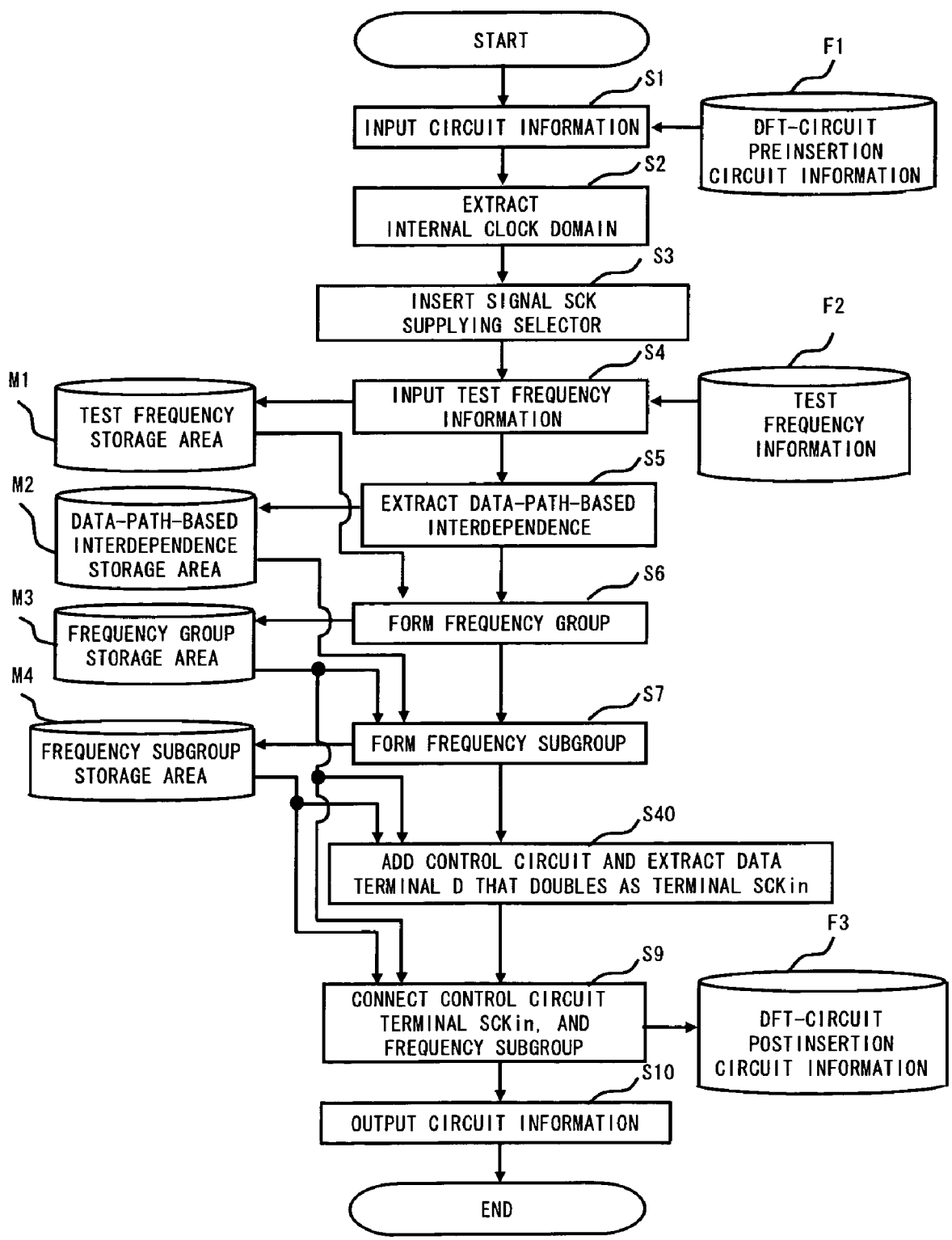
FIG. 15 is a flowchart of a procedure of adding a DFT circuit according to a fourth embodiment of the present invention.

FIG. 15 is a flowchart of a procedure of adding a DFT circuit in the semiconductor device of the fourth embodiment. As shown in FIG. 15, in the semiconductor device of the fourth embodiment, step S40 is executed in place of step S8 in the flowchart of the procedure of adding a DFT circuit to the semiconductor device of the first embodiment. In step S40, a control circuit is added, and a user data input terminal D that doubles as the scan clock supply terminal $SCK_{in}$ is extracted. As for the extracted user data input terminal D, for example, a terminal receiving a clock signal the frequency of which is the same as a test frequency of the internal clock domain.

Figure 16:
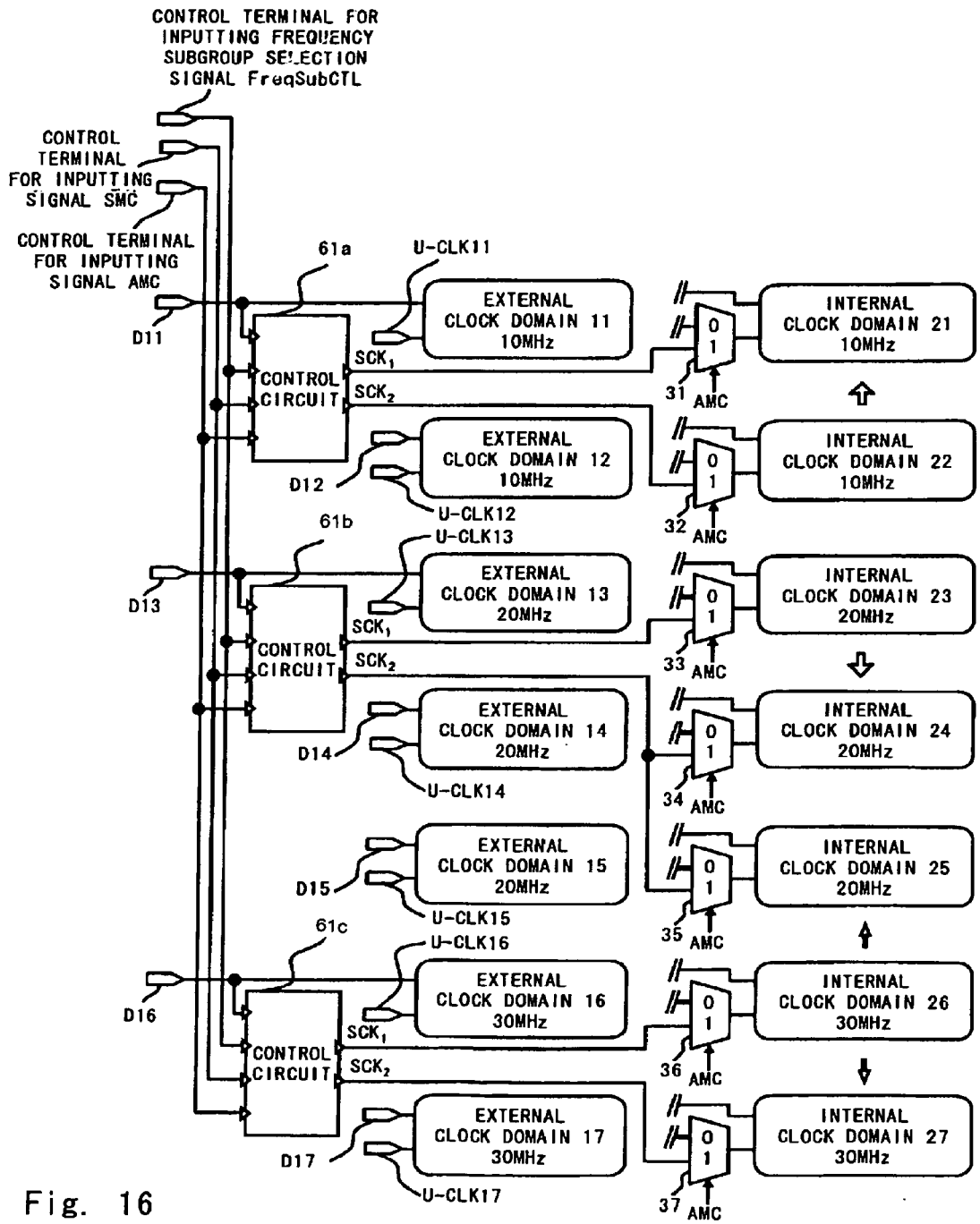
FIG. 16 is a block diagram of a semiconductor device added with a DFT circuit of the fourth embodiment.

FIG. 16 is a block diagram of a semiconductor device added with a DFT circuit generated in accordance with the flowchart of FIG. 15. As shown in FIG. 16, in the semiconductor device of the fourth embodiment, control circuits 61a, 61b, and 61c are added. The control circuits 61a, 61b, and 61c are connected with user data input terminals D11, D13, and D16. The user data input terminal D11 is a terminal for supplying a data signal to the external clock domain 11. The user data input terminal D13 is a terminal for supplying a data signal to the external clock domain 13. The user data input terminal D16 is a terminal for supplying a data signal to the external clock domain 16.

Further, the control circuits 61a, 61b, and 61c are supplied with a frequency subgroup selection signal FreqSubCTL, a scan mode control signal SMC, and a test mode control signal AMC. Further, the control circuits 61a, 61b, and 61c have scan clock output terminals $SCK_1$ and $SCK_2$. The scan clock output terminals $SCK_1$ and $SCK_2$ are the same as those of the first embodiment.

Figure 17:
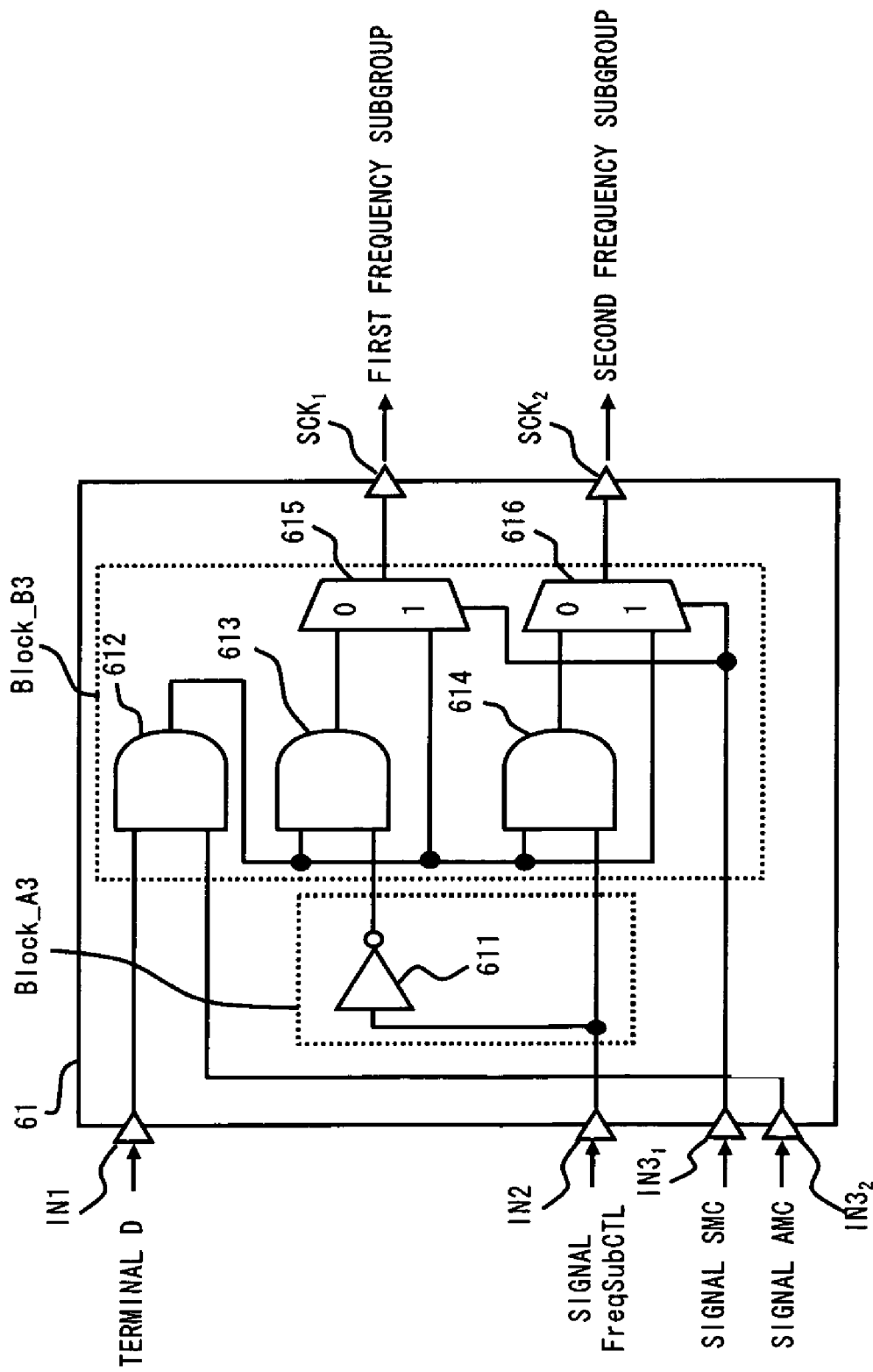
FIG. 17 is a circuit diagram of a DFT circuit of the fourth embodiment.
Figure 19:
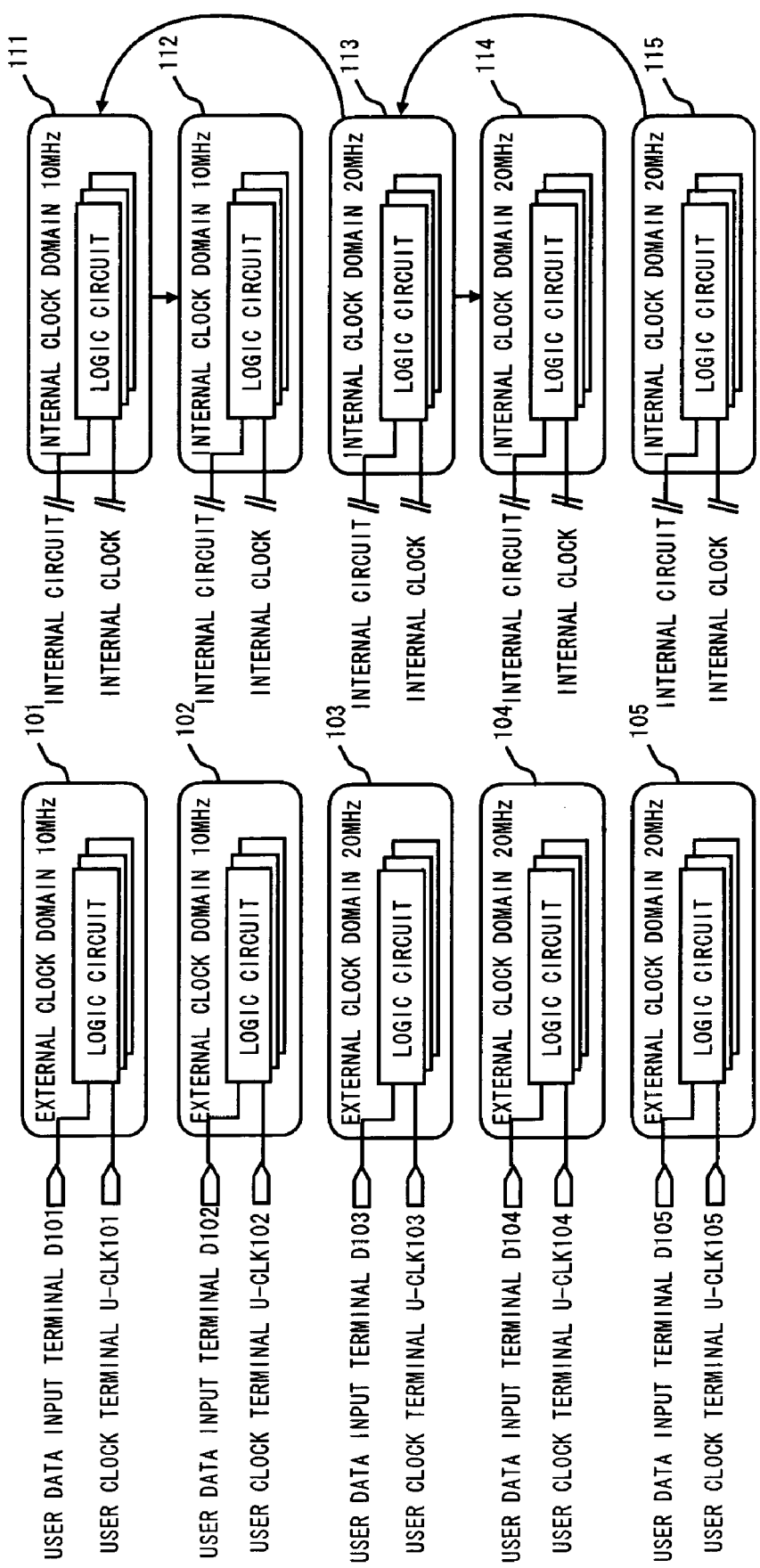
FIG. 19 is a block diagram of a semiconductor device of the Related Art 1, which is not added with a DFT circuit.
Figure 20:
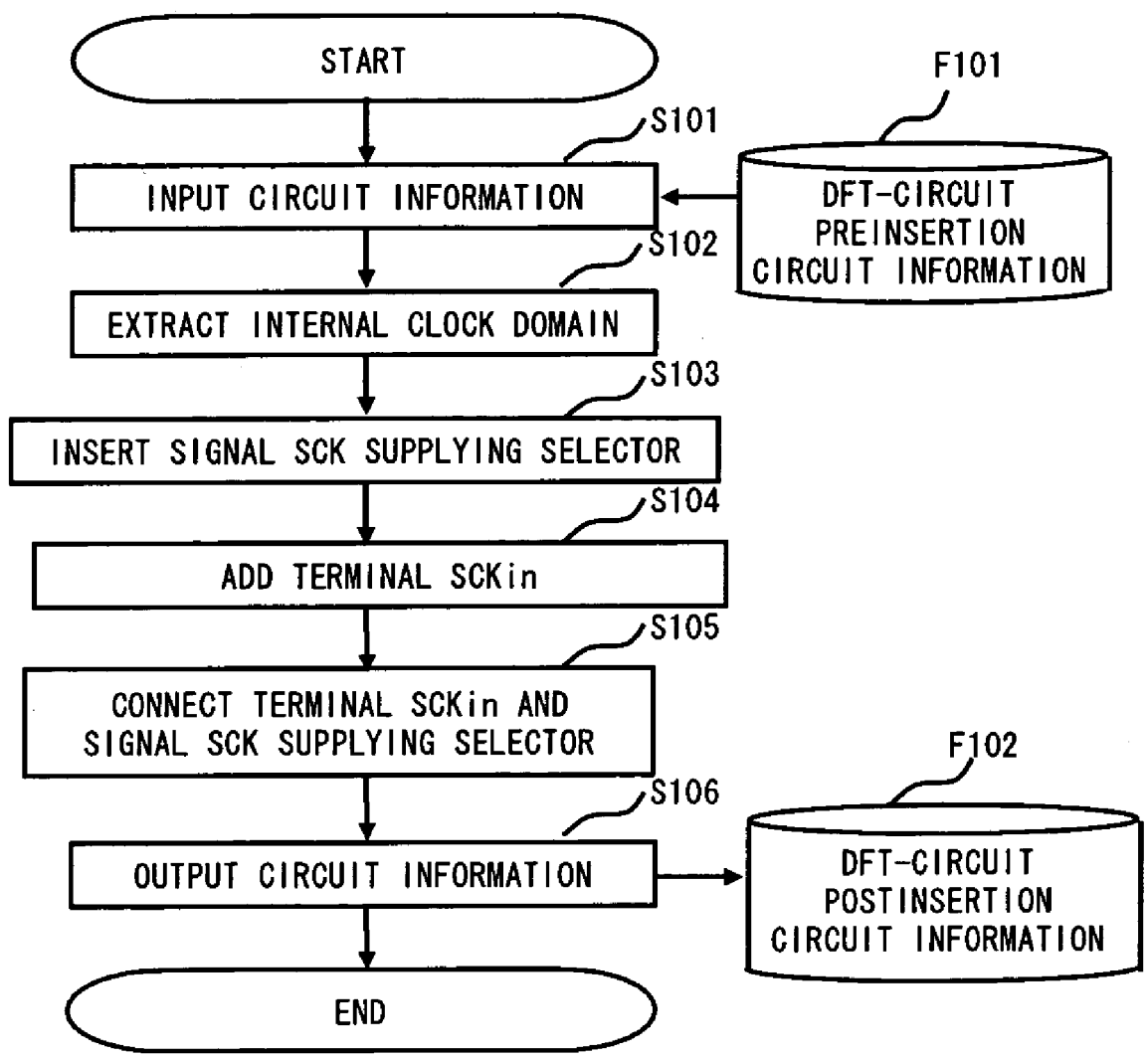
FIG. 20 is a flowchart of a procedure of adding a DFT circuit of the Related Art 1.
Figure 21:
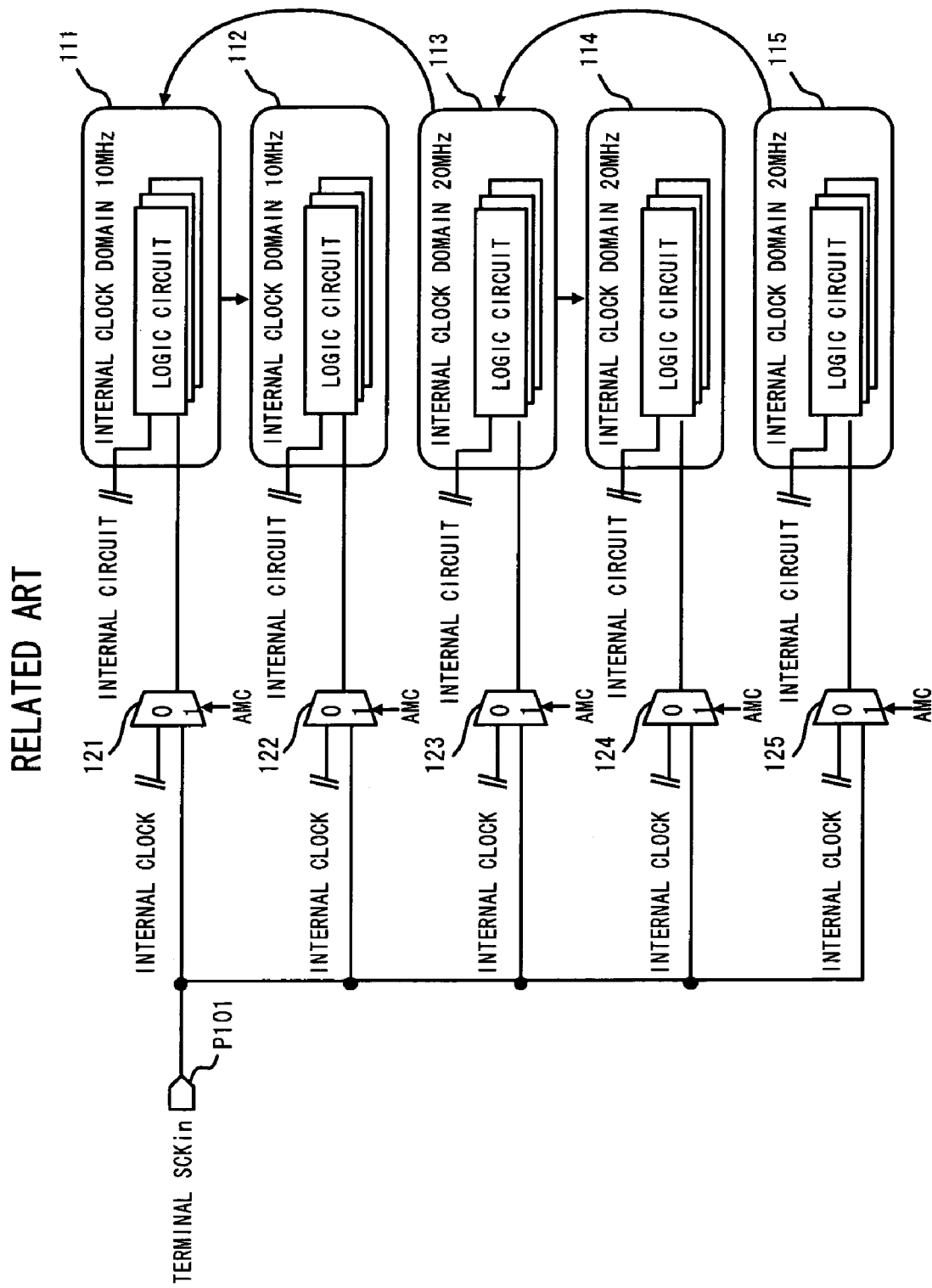
FIG. 21 is a block diagram of the semiconductor device of the Related Art 1, which is added with a DFT circuit.
Figure 22:
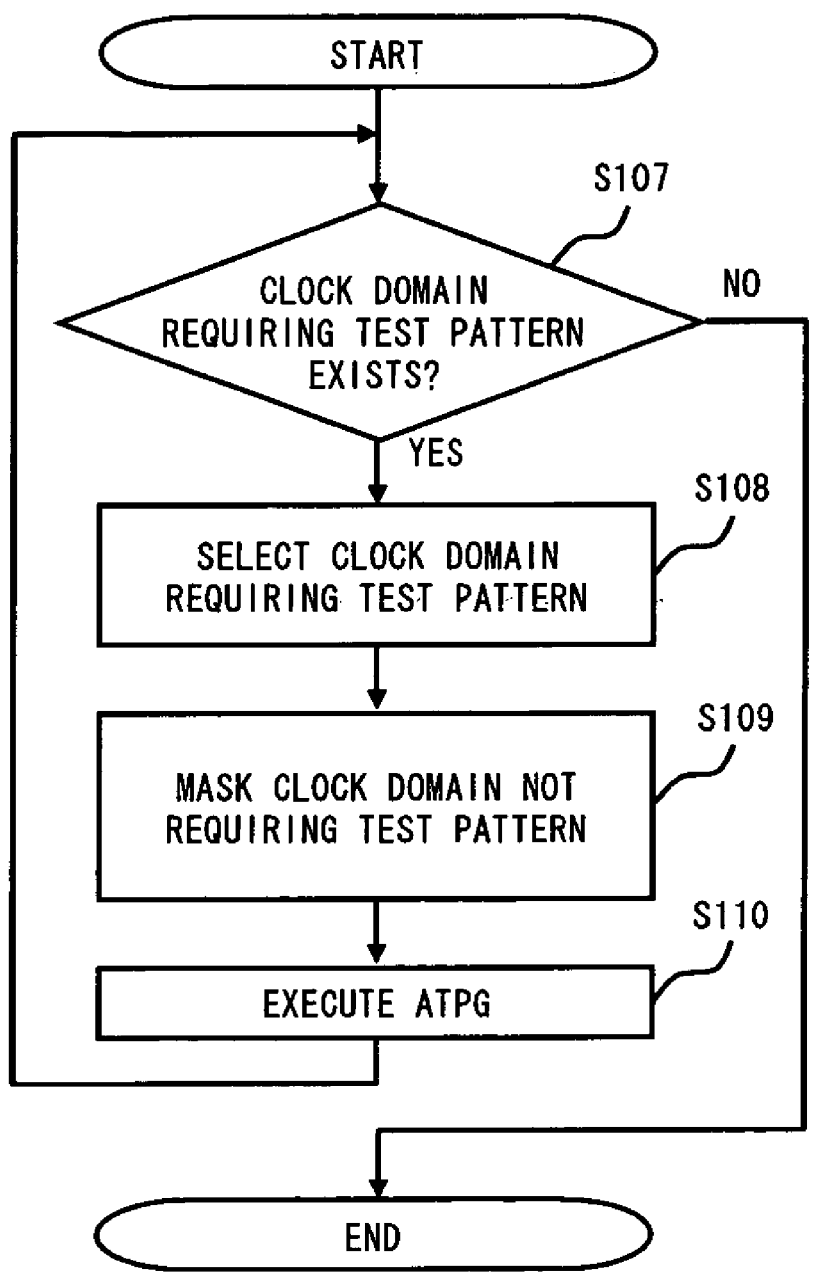
FIG. 22 is a flowchart of an ATPG process of the Related Art 1.
Figure 23:
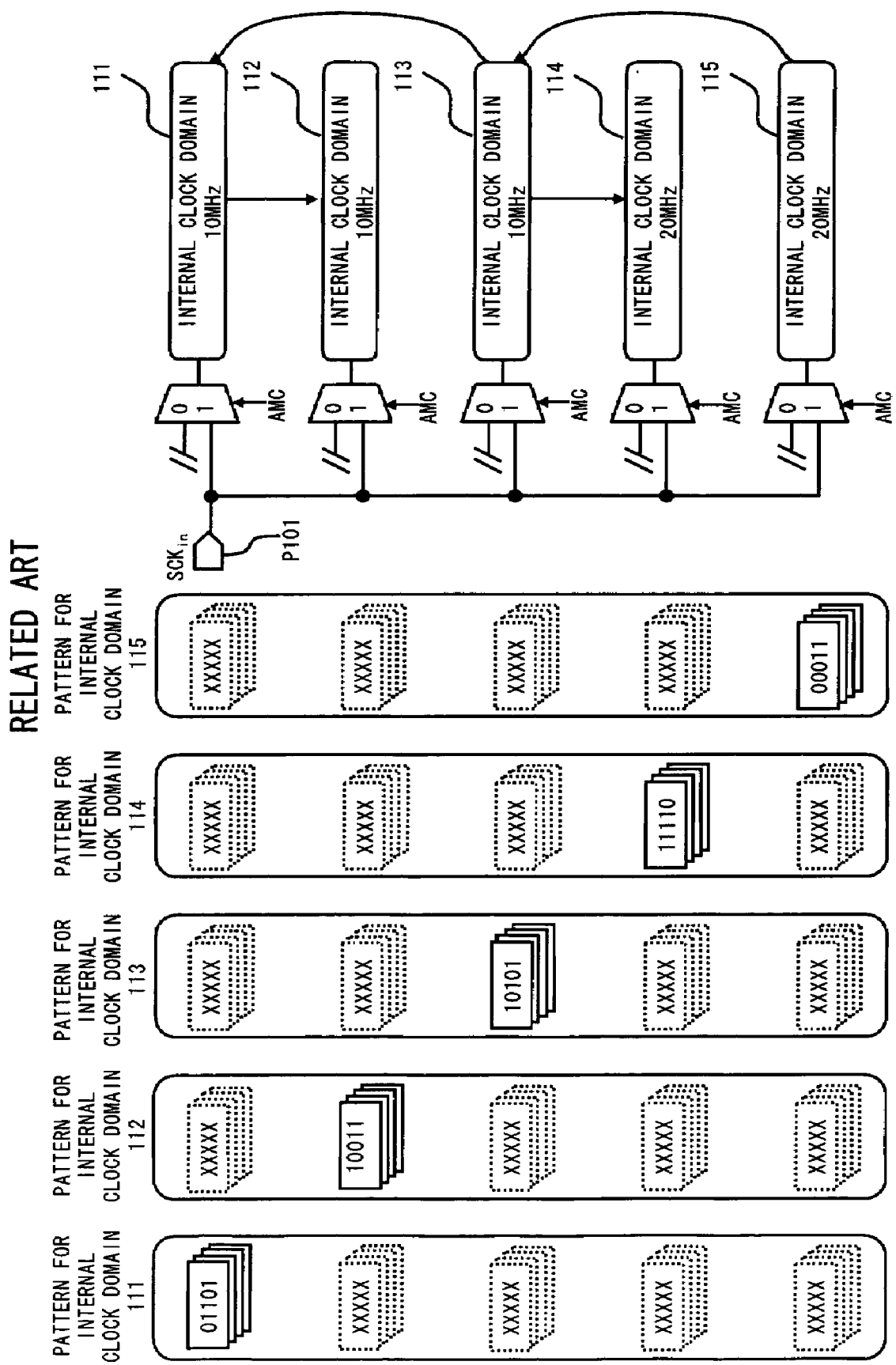
FIG. 23 shows a test pattern generated for the semiconductor device of the Related Art 1.
Figure 24:
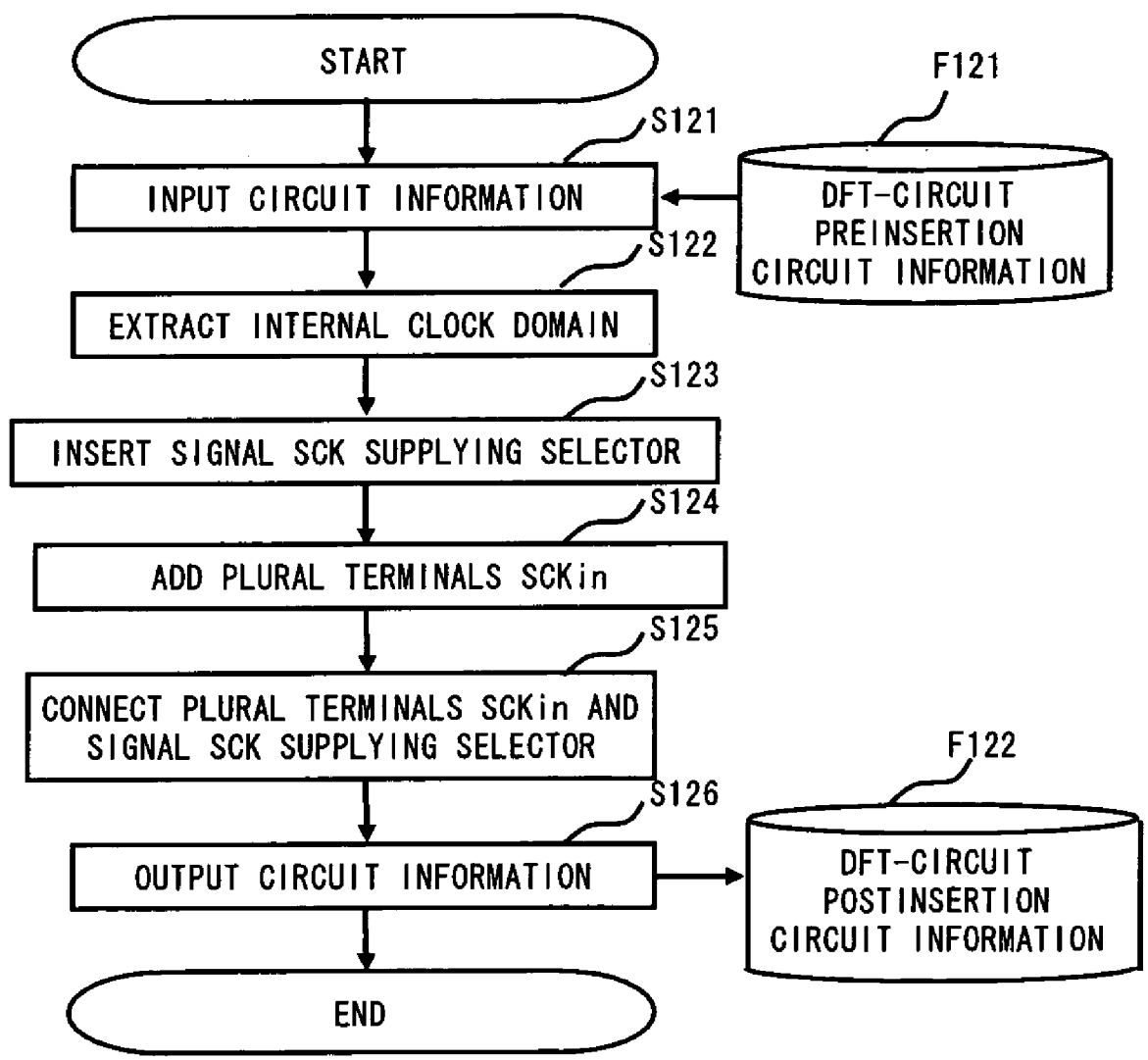
FIG. 24 is a flowchart of a procedure of adding a DFT circuit of the Related Art 2.
Figure 25:
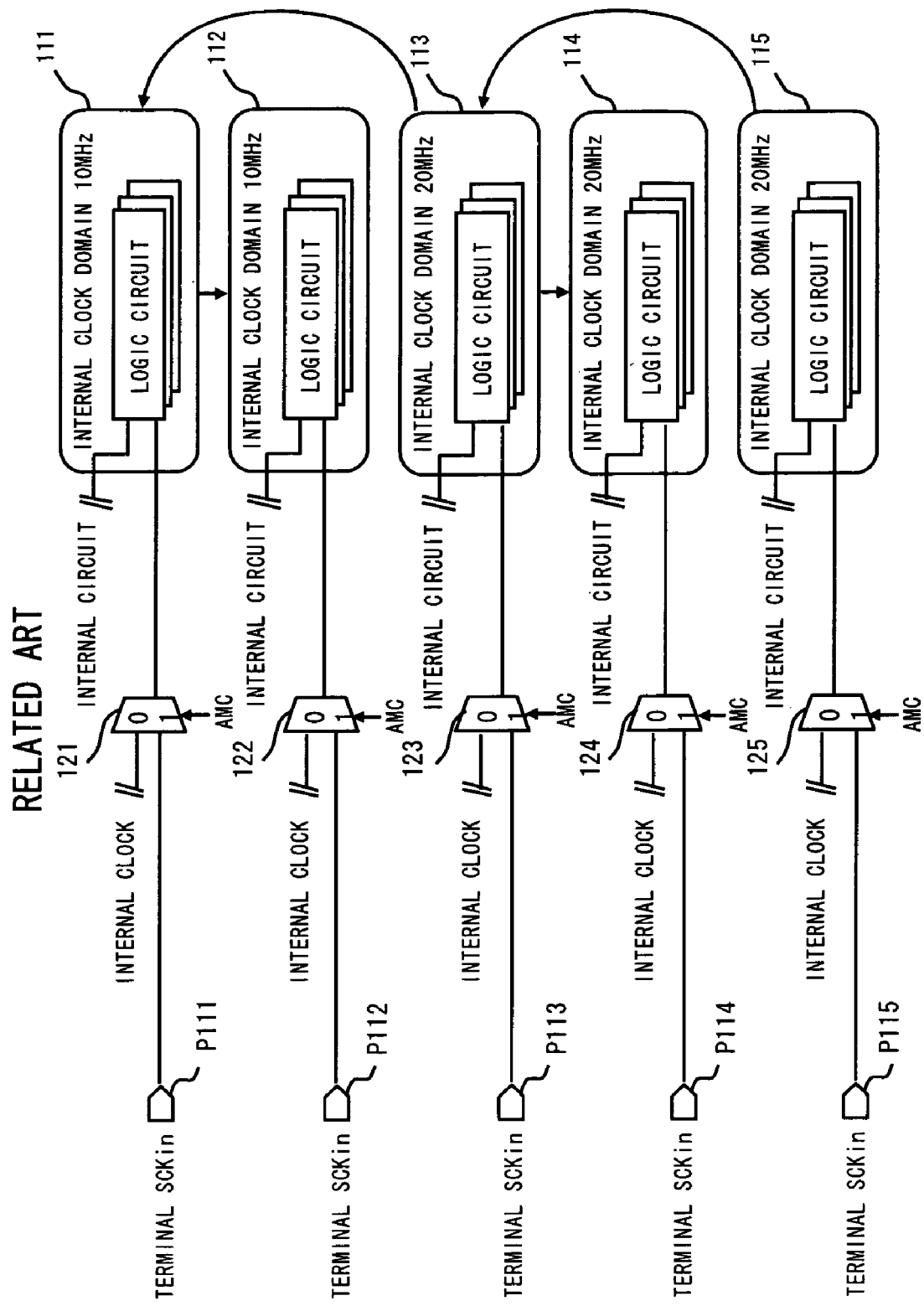
FIG. 25 is a block diagram of a semiconductor device, which is added with a DFT circuit of the Related Art 2.
Figure 26:
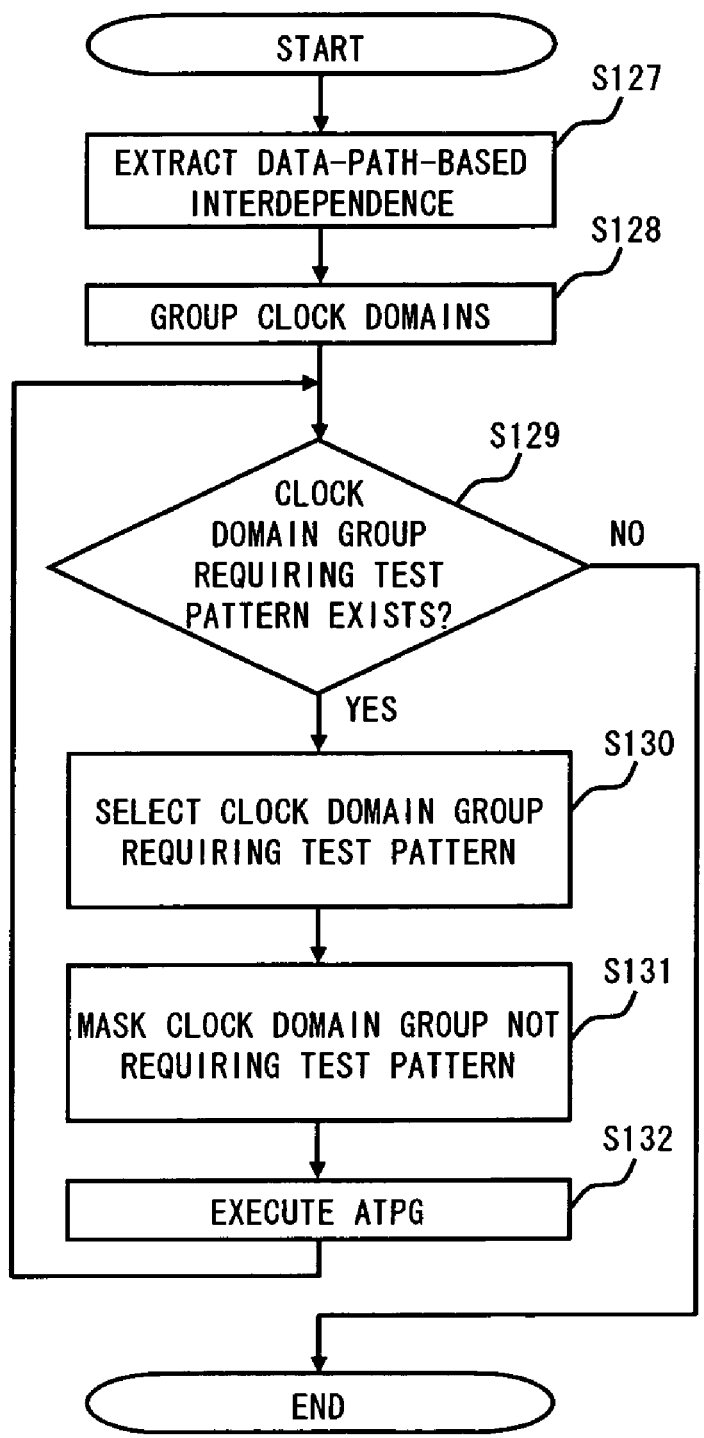
FIG. 26 is a flowchart of an ATPG process of the Related Art 2.
Figure 27:
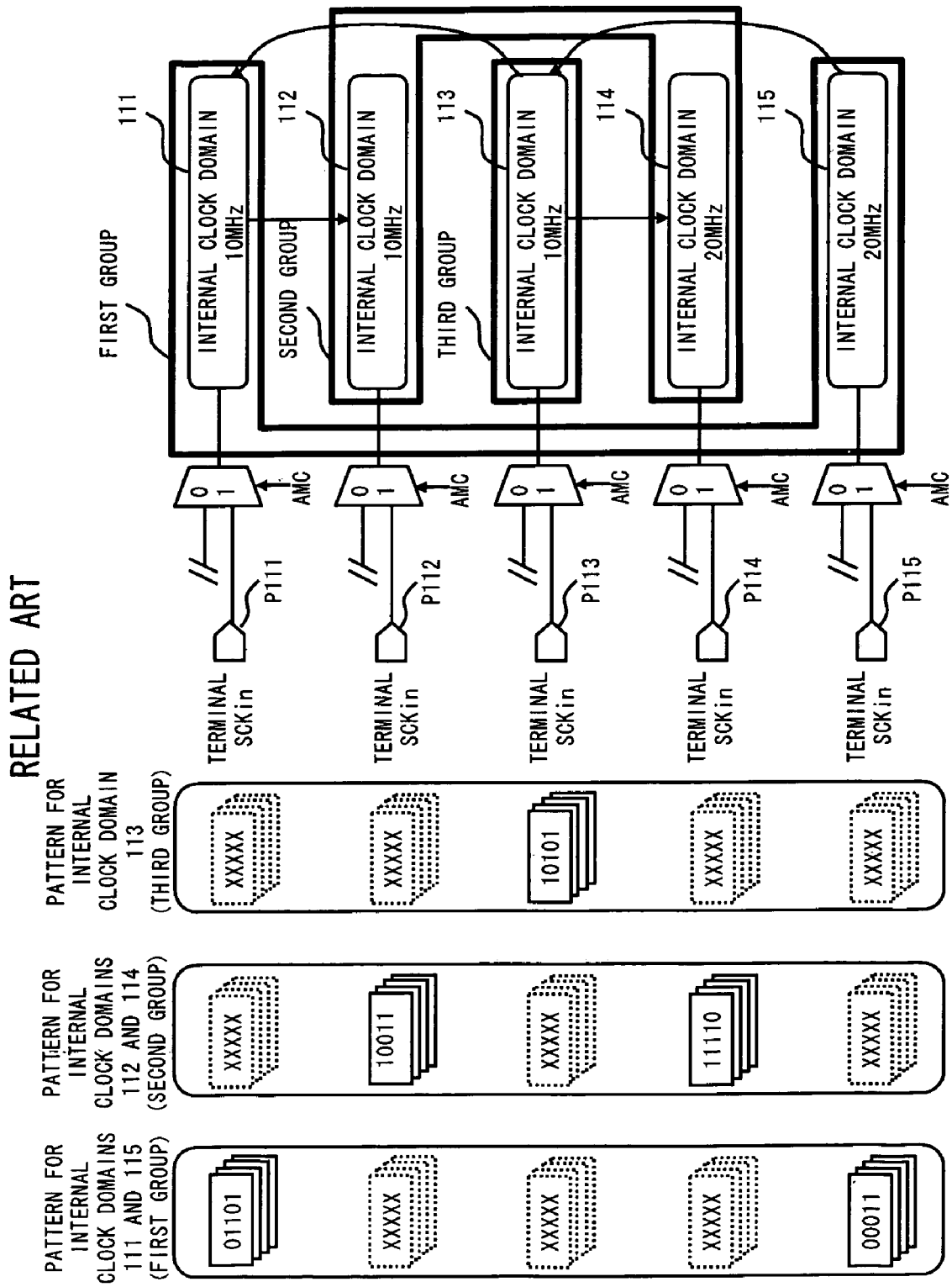
FIG. 27 shows a test pattern generated for the semiconductor device of the Related Art 2.

Here, the control circuits 61a, 61b, and 61c are described in detail below. The control circuits 61a, 61b, and 61c are the same and thus described below as a control circuit 61. FIG. 17 is a circuit diagram of the control circuit 61. The control circuit 61 includes input terminals IN1, IN2, $IN3_1$, and $IN3_2$, output terminal $SCK_1$ and $SCK_2$, a decoder block Block_A3, and a scan clock control block Block_B3. The input terminal IN1 is connected with a user data input terminal D. The input terminal IN2 is connected with a control terminal receiving a frequency subgroup selection signal FreqSubCTL. The input terminal $IN3_1$ is supplied with a scan mode control signal SMC. The input terminal $IN3_2$ is supplied with a test mode control signal AMC. The decoder block Block_A3 has an inverter 611. The scan clock control block Block_B3 has AND circuit 612 to 614 and selectors 615 and 616.

The control circuit 61 operates based on the control logic of FIG. 18 by use of these elements. As shown in FIG. 18, the control circuit 61 outputs an off state value "X" for the scan clock output terminals $SCK_1$ and $SCK_2$ regardless of values of the scan mode control signal SMC and the frequency subgroup selection signal FreqSubCTL if the test mode control signal AMC is at "Low" level.

Further, if test mode control signal AMC is at "High" level, a scan clock signal is output from the scan clock output terminals $SCK_1$ and $SCK_2$ based on the values of scan mode control signal SMC and the frequency subgroup selection signal FreqSubCTL. For example, if the scan mode control signal SMC is at "Low" level, and the frequency subgroup selection signal FreqSubCTL is at "Low" level, a scan clock signal is output from the scan clock output terminal $SCK_1$, and an off state value "X" is output from the scan clock output terminal $SCK_2$. If the scan mode control signal SMC is at "Low" level, and the frequency subgroup selection signal FreqSubCTL is at "High" level, an off state value "X" is output from the scan clock output terminal $SCK_1$, and a scan clock signal is output from the scan clock output terminal $SCK_2$. Further, if the scan mode control signal SMC is at "High" level, a scan clock signal is output from the scan clock output terminal $SCK_1$, $SCK_2$ regardless of values of the frequency subgroup selection signal FreqSubCTL.

As understood from the above description, the semiconductor device of the fourth embodiment uses a user data input terminal D as the scan clock supply terminal. That is, it is unnecessary to add a terminal for inputting a scan clock signal, so the semiconductor device of the fourth embodiment can reduce the number of added terminals as compared with the semiconductor device of the first embodiment. Further, the semiconductor device of the fourth embodiment does not need to supply a clock to the external clock domain, so the control circuit can be more simplified than the semiconductor circuit of the third embodiment.

Incidentally, as another embodiment of the present invention, the processes of step S4 and S5 of the flowchart of FIG. 2 may be preformed in reverse order. Further, the processes of step S6 and S7 of the flowchart of FIG. 2 may be preformed in reverse order.

It is apparent that the present invention is not limited to the above embodiment that may be modified and changed without departing from the scope and spirit of the invention.

What is claimed is:

1. A semiconductor device comprising:
   a plurality of clock domains including a plurality of logic circuits operating in accordance with a clock signal; and
   a control circuit selectively supplying the clock signal to a predetermined number of clock domains selected from the plurality of clock domains based on a control signal, wherein
   the control circuit is provided for each of a plurality of clock domain groups including clock domains operating in accordance with clock signals of the same frequency among the plurality of clock domains, and
   the control circuit selectively supplies the clock signal to a clock domain group including clock domains having no data-path-based interdependence among the clock domain groups including clock domains operating in accordance with clock signals of the same frequency, based on the control signal.

2. The semiconductor device according to claim 1, wherein the control circuit controls a shift cycle and a capture cycle of the clock domains upon scan test and controls the clock signal during normal use based on the control signal.

3. The semiconductor device according to claim 2, wherein the control signal includes a selection signal and a test control signal, and the control circuit selectively supplies the clock signal to a clock domain selected based on the control signal if a test signal represents testing of the logic circuit.

4. The semiconductor device according to claim 1, wherein the plurality of clock domains are classified into a plurality of first groups including a predetermined number of clock domains in accordance with an operating frequency, and clock domains operating independently of each other among the clock domains in one first group are grouped to obtain a plurality of second groups, and
   the control circuit controls the clock signal supplied to each of the second groups.

5. The semiconductor device according to claim 4, wherein the control circuit selects at least one of the second groups based on the control signal and supplies a first clock to a selected group.

6. A semiconductor device comprising:
   a plurality of clock domains including a plurality of logic circuits operating in accordance with a clock signal; and
   a control circuit selectively supplying the clock signal to a predetermined number of clock domains selected from the plurality of clock domains based on a control signal, wherein
   the clock signal is input to the control circuit from an additional first clock supply terminal.

7. A semiconductor device comprising:
   a plurality of clock domains including a plurality of logic circuits operating in accordance with a clock signal; and
   a control circuit selectively supplying the clock signal to a predetermined number of clock domains selected from the plurality of clock domains based on a control signal, wherein
   the clock signal is input to the control circuit from an existing user clock terminal receiving a user clock.

8. A semiconductor device comprising:
   a plurality of clock domains including a plurality of logic circuits operating in accordance with a clock signal; and
   a control circuit selectively supplying the clock signal to a predetermined number of clock domains selected from the plurality of clock domains based on a control signal, wherein
   the clock signal is input to the control circuit from an existing user data input terminal receiving user data.

9. A computer program product embodied in a computer readable medium, which when executed causes a computer to execute a procedure of designing a tester circuit of a semiconductor device including a plurality of clock domains including a plurality of logic circuits operating in accordance with a clock signal, the procedure comprising the steps of:
   reading first circuit information prior to insertion of the tester circuit and second circuit information representing a frequency of the clock signal supplied to a clock domain, and grouping clock domains to be tested as first groups with the clock signals of the same frequency among the plurality of clock domains;
   grouping clock domains having no data-path-based interdependence as second groups among the clock domains in the first group, and adding to the first circuit information, information about control circuits corresponding to the first groups, supplying the clock signal to each of the first groups, and distributing control signals to the second groups based on a control signal.

10. The computer program, embodied in a computer readable medium as defined in claim 9, wherein a control circuit selects at least one of the second groups based on a first control signal and supplies the clock signal to the selected group.

11. The computer program, embodied in a computer readable medium as defined in claim 9, wherein the control circuit controls a shift cycle and a capture cycle of the clock domains upon scan test and controls a clock signal during normal use based on a second control signal.

12. A method of adding a tester circuit that adds the tester circuit to a semiconductor device including a plurality of clock domains including a plurality of logic circuits operating in accordance with a clock signal by use of a computer, comprising:

inputting first circuit information prior to insertion of the tester circuit;

deriving test frequency information of a clock domain based on second circuit information representing a frequency of the clock signal supplied to the clock domain;

extracting data-path-based interdependence representing how the clock domains interface with each other based on the first circuit information;

deriving information about a plurality of first groups obtained by grouping a predetermined number of clock domains based on the first circuit information and the test frequency information;

deriving information about a plurality of second groups obtained by grouping clock domains operating independently of each other in one first group based on the data-path-based interdependence and the information about the first group; and adding to the first circuit information, information about a control circuit including output terminals of the clock signal as many as the second groups in the connected first group, and controlling a clock domain to which the clock signal is supplied, for each of the second groups.

13. The method of adding a tester circuit according to claim 12, wherein the control circuit controls the clock signal supplied to each of the second groups.

14. The method of adding a tester circuit according to claim 12, wherein the control circuit selects at least one of the second groups and supplies the clock signal to the selected group based on a first control signal.

15. The method of adding a tester circuit according to claim 12, wherein the control circuit controls a shift cycle and a capture cycle of the clock domains upon scan test and controls the clock signal during normal use based on the second control signal.

16. The method of adding a tester circuit according to claim 12, wherein the clock signal is input to the control circuit from an additional first clock supply terminal.

17. The method of adding a tester circuit according to claim 12, wherein the clock signal is input to the control circuit from an existing user clock terminal receiving a user clock.

18. The method of adding a tester circuit according to claim 12, wherein the clock signal is input to the control circuit from an existing user data input terminal receiving user data.

* * * * *